US009599906B2

(12) United States Patent
Watanabe

(10) Patent No.: US 9,599,906 B2
(45) Date of Patent: Mar. 21, 2017

(54) METHOD FOR DRIVING SPATIAL LIGHT MODULATOR, METHOD FOR FORMING PATTERN FOR EXPOSURE, EXPOSURE METHOD, AND EXPOSURE APPARATUS

(75) Inventor: Yoji Watanabe, Okegawa (JP)

(73) Assignee: Nikon Corporation, Tokyo (JP)

( * ) Notice: Subject to any disclaimer, the term of this patent is extended or adjusted under 35 U.S.C. 154(b) by 658 days.

(21) Appl. No.: 13/825,948

(22) PCT Filed: Sep. 26, 2011

(86) PCT No.: PCT/JP2011/071929
§ 371 (c)(1),
(2), (4) Date: May 15, 2013

(87) PCT Pub. No.: WO2012/043497
PCT Pub. Date: Apr. 5, 2012

(65) Prior Publication Data
US 2013/0222781 A1 Aug. 29, 2013

(30) Foreign Application Priority Data

Sep. 27, 2010 (JP) ................................. 2010-215107

(51) Int. Cl.
*G03F 7/20* (2006.01)
*G02B 26/06* (2006.01)
(52) U.S. Cl.
CPC ......... *G03F 7/70291* (2013.01); *G02B 26/06* (2013.01); *G03F 7/70508* (2013.01)
(58) Field of Classification Search
CPC . G02B 26/06; G03F 7/70291; G03F 7/70508; G03F 7/70091; G03F 7/70116;
(Continued)

(56) References Cited

U.S. PATENT DOCUMENTS 5,312,513 A    5/1994  Florence et al.
6,885,493 B2   4/2005  Ljungblad et al.
(Continued)

FOREIGN PATENT DOCUMENTS

JP    2006-128194         5/2006
NL    WO 2010134017 A1 * 11/2010   ............ B82Y 10/00
WO    WO 2009/060745 A1   5/2009

OTHER PUBLICATIONS

Notice of Reasons for Rejection from related Japanese Patent Application No. 2012-536448, dated May 26, 2015, 10 pages (with English translation).
(Continued)

*Primary Examiner* — Michelle M Iacoletti
(74) *Attorney, Agent, or Firm* — Klarquist Sparkman, LLP

(57) ABSTRACT

A method for driving a spatial light modulator includes setting a plurality of mirror elements in a first region into a state of phase 0, setting a plurality of optical elements in a second region adjacent in a Y-direction to the first region into a state of phase π, and setting auxiliary pattern elements consisting of a plurality of mirror elements arranged at a pitch P over a resolution limit of a projection optical system in an X-direction in a boundary region extending in the X-direction between the first region and the second region, into the state of phase π. In projecting a pattern onto an object with use of the spatial light modulator having the array of optical elements, the pattern can be formed in position accuracy or shape accuracy finer than the width of images of the optical elements.

36 Claims, 13 Drawing Sheets

(58) Field of Classification Search
CPC .. G03F 7/702; G03F 7/70358; G03F 7/70383; G03F 7/70425; G03F 7/70433; G03F 7/70458; G03F 7/70466; G03F 7/70633
See application file for complete search history.

(56) References Cited

U.S. PATENT DOCUMENTS

| | | | |
|---|---|---|---|
| 7,184,192 B2* | 2/2007 | Sandstrom | B23K 26/032 |
| | | | 345/85 |
| 2005/0270515 A1* | 12/2005 | Troost | G03F 7/70275 |
| | | | 355/69 |
| 2006/0068334 A1* | 3/2006 | Sandstrom | G03F 7/70291 |
| | | | 430/322 |
| 2007/0242247 A1 | 10/2007 | Shiraishi | |
| 2008/0073588 A1* | 3/2008 | Kruit | B82Y 10/00 |
| | | | 250/492.21 |

OTHER PUBLICATIONS

Chen et al., "Design and fabrication of tilting and piston micromirrors for maskless lithography," *Proc. of SPIE*, 5751:1023-1037 (2005).
International Search Report for International Application No. PCT/JP2011/071929, 2 pages, mailed Nov. 22, 2011.

\* cited by examiner

Fig.2
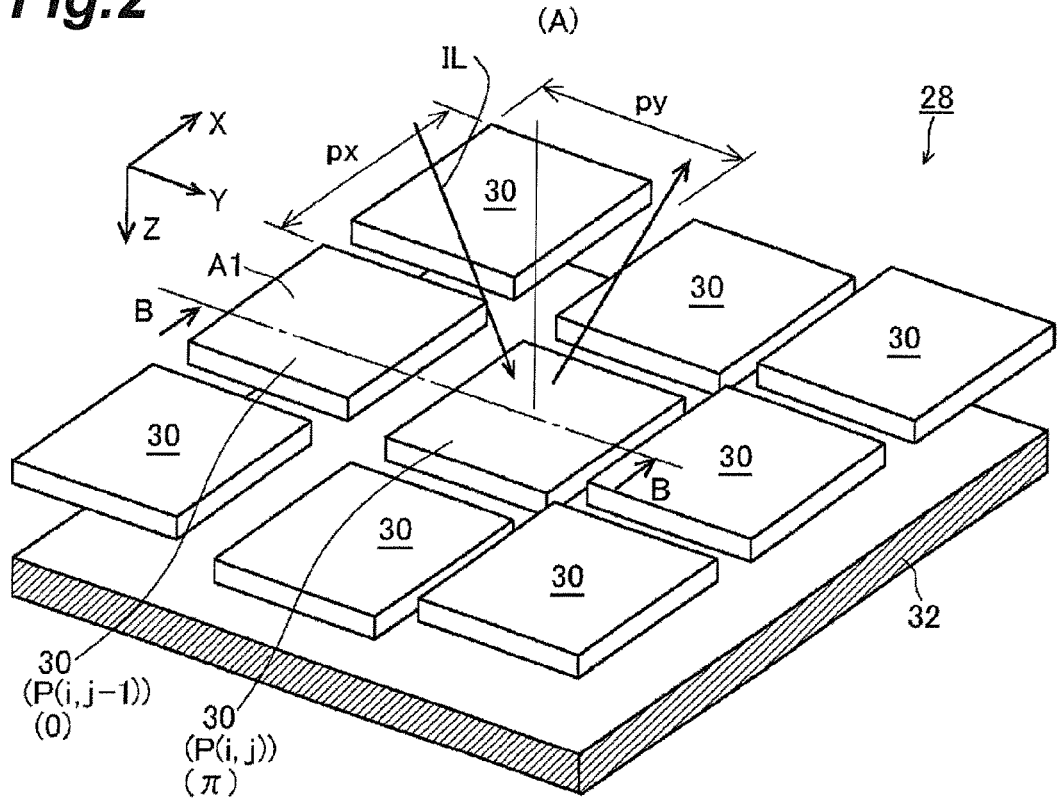
(A)
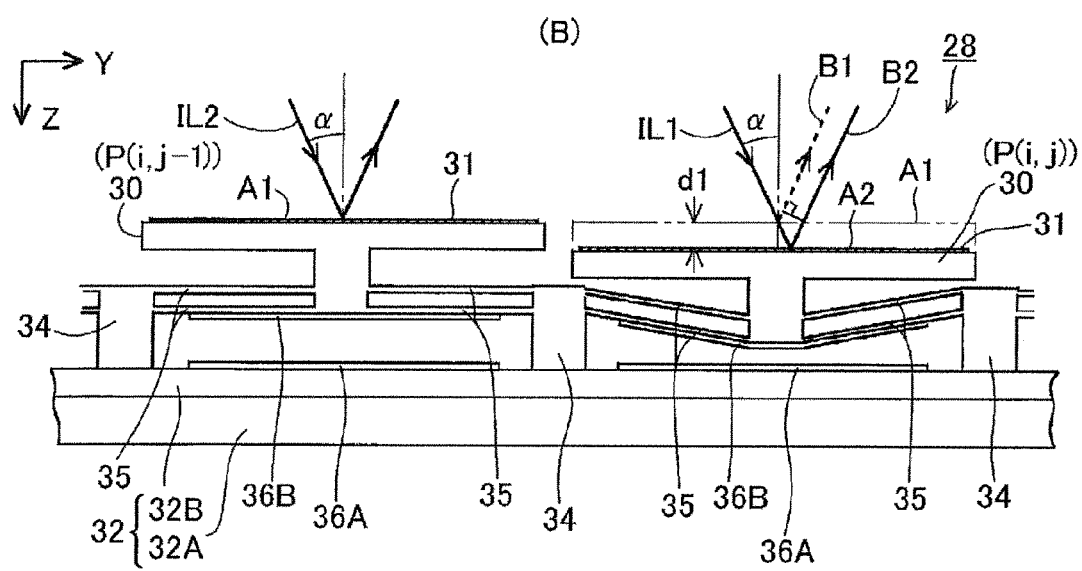
(B)

Fig.3
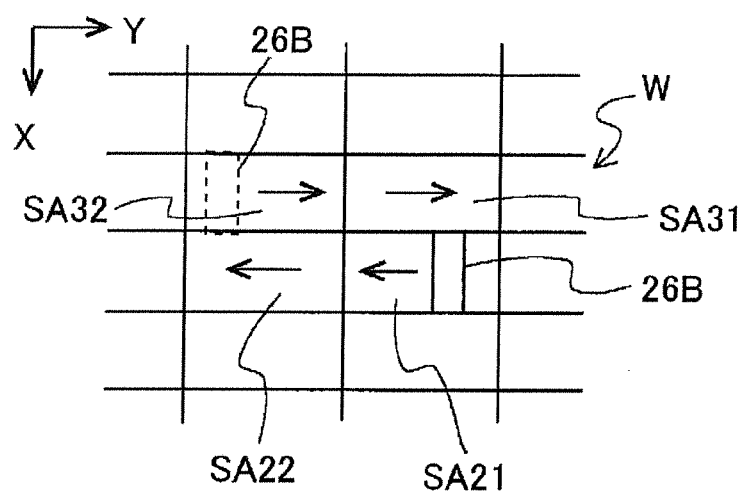
(A)
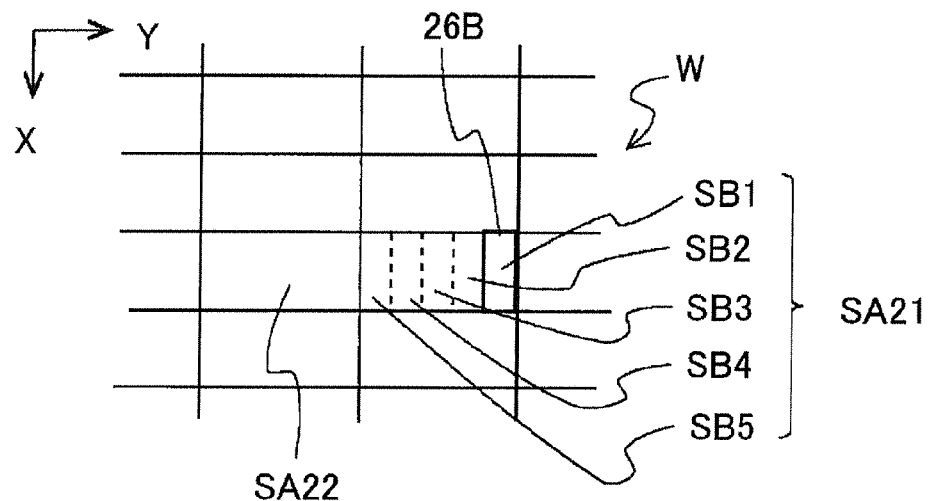
(B)

Fig.6
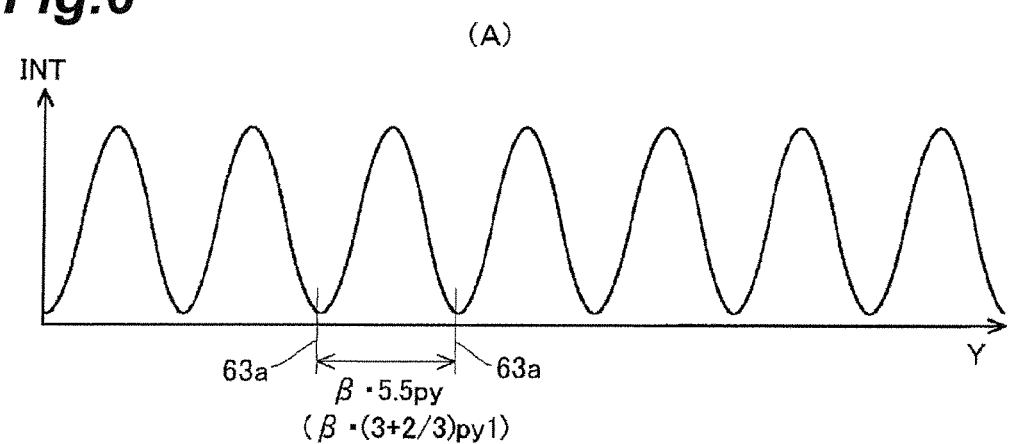
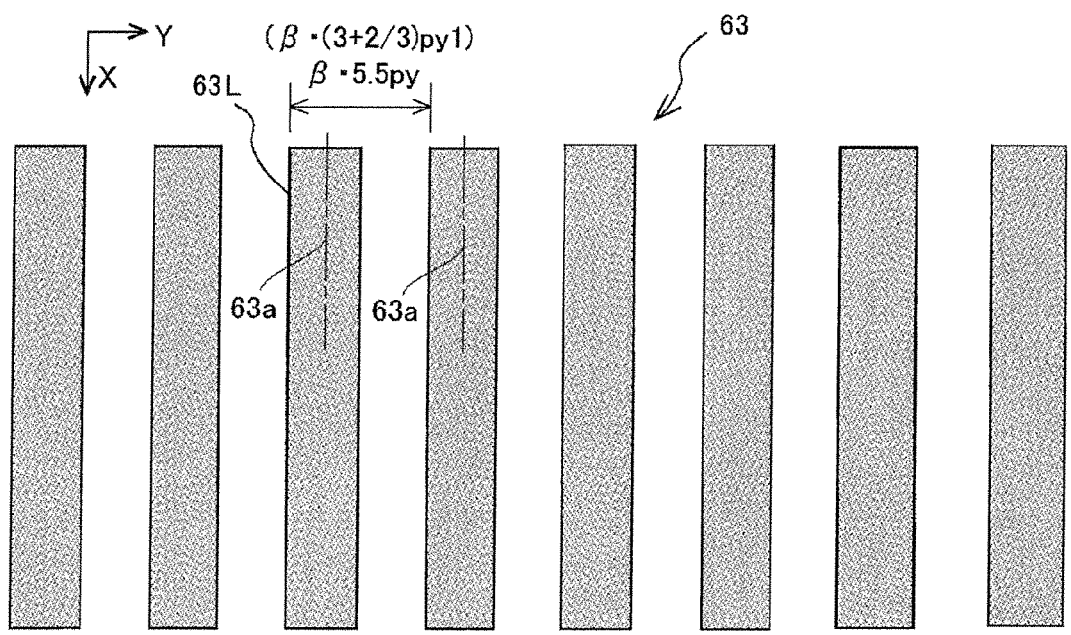

Fig.8
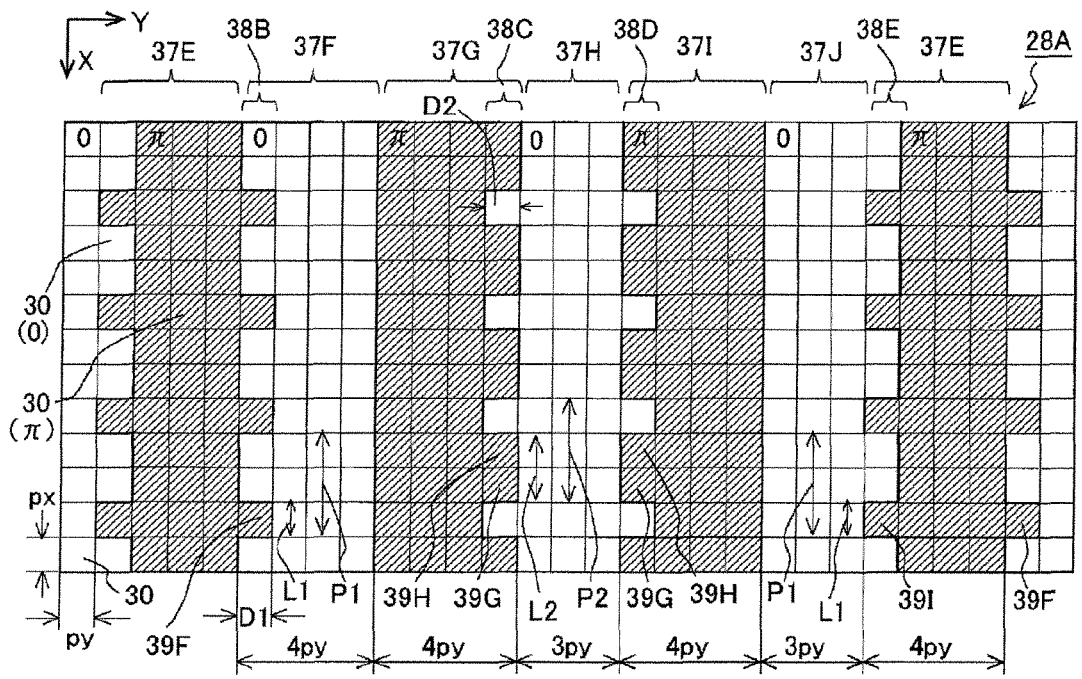
(A)
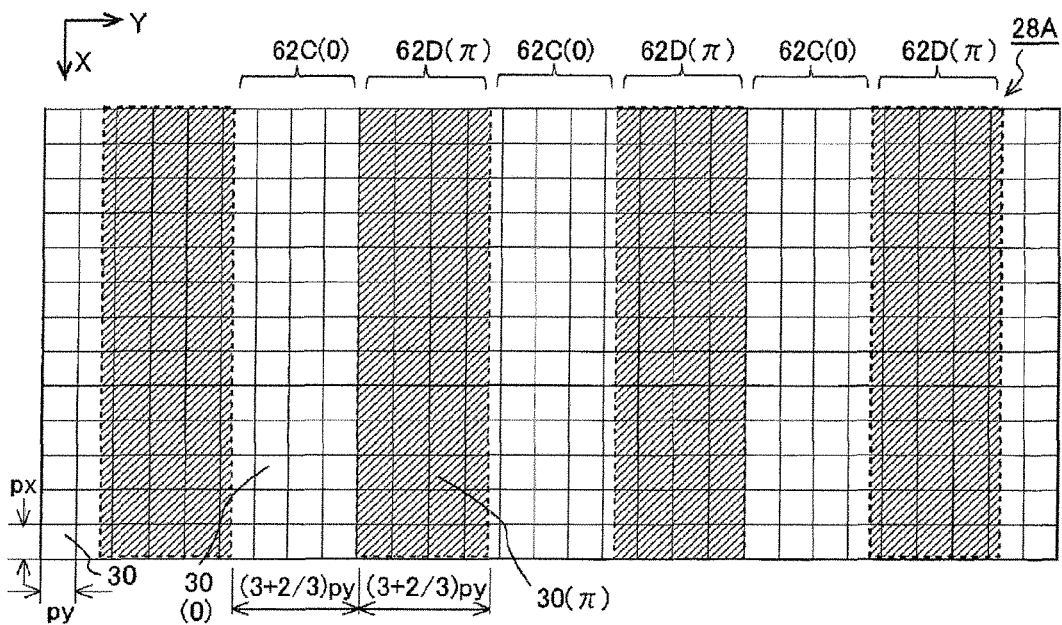
(B)

METHOD FOR DRIVING SPATIAL LIGHT MODULATOR, METHOD FOR FORMING PATTERN FOR EXPOSURE, EXPOSURE METHOD, AND EXPOSURE APPARATUS

CROSS REFERENCE TO RELATED APPLICATIONS

This application is the U.S. National Stage of International Application No. PCT/JP2011/071929, filed Sep. 26, 2011, which in turn claims priority to and the benefit of JP Application No. 2010-215107, filed on Sep. 27, 2010, both of which are incorporated herein by reference in their respective entireties.

TECHNICAL FIELD

The present invention relates to a method for driving a spatial light modulator having a plurality of optical elements, a method for forming a pattern for exposure with the use of the spatial light modulator, an exposure technology to expose an object with the use of the spatial light modulator, and a device manufacturing technology using the exposure technology.

BACKGROUND ART

The exposure apparatus of a one-shot exposure type such as steppers or the exposure apparatus of a scanning exposure type such as scanning steppers are used for forming a predetermined pattern in each shot area on a substrate such as a wafer or a glass plate through a projection optical system, for example, in a lithography process for manufacturing devices (electronic devices or microdevices) such as semiconductor devices or liquid crystal display devices.

There is the recently-proposed exposure apparatus of a so-called maskless method to form a variable pattern on the object plane of the projection optical system, using spatial light modulators (SLM) having an array of many microscopic mirrors an inclination angle of each of which is variable, instead of masks, for efficiently manufacturing each of devices while suppressing an increase of manufacturing cost due to preparation of masks for respective types of devices and masks for respective layers on the substrate (e.g., cf. Patent Document 1). There are also the proposed spatial light modulators of a type having an array of many micromirrors a height of a reflective surface of each of which is controllable, in order to control a phase distribution of incident light (e.g., cf. Non-Patent Document 1).

CITATION LIST

Patent Document

Patent document 1: International Publication WO 2009/060745

Non-Patent Document

Non-Patent Document 1: Yijian Chen et al., "Design and fabrication of tilting and piston micromirrors for maskless lithography," Proc. of SPIE (U.S.A.) Vol. 5751, pp. 1023-1037 (2005)

SUMMARY OF INVENTION

Technical Problem

When a pattern was formed on a substrate with the use of the conventional spatial light modulator, the pattern was formed in minimum units of images of the respective micromirrors (optical elements) of the spatial light modulator. For this reason, it was difficult to set the position of the pattern, for example, in position accuracy finer than the width of the images of the micromirrors and it was also difficult to form a line-and-space pattern with the pitch equal to a non-integral multiple of the width of the images of the micromirrors.

In light of the above-described circumstances, an object of aspects of the present invention is to form a pattern in position accuracy or shape accuracy finer than a width of images of optical elements in a process of projecting (or forming) the pattern on an object by use of a spatial light modulator having an array of the optical elements.

Solution of Problem

A first aspect of the present invention provides a method for driving a spatial light modulator having an array of optical elements each of which can guide light to a projection optical system. This driving method comprises: setting a plurality of optical elements in a first region into a first state; setting a plurality of optical elements in a second region adjacent in a first direction to the first region into a second state different from the first state; and setting a plurality of optical elements arranged in a first boundary region extending in a second direction intersecting with the first direction between the first region and the second region, and at a pitch over a resolution limit of the projection optical system in the second direction, into the first state or into the second state.

A second aspect provides an exposure method for exposing a substrate with exposure light via a spatial light modulator having an array of optical elements and via a projection optical system. This exposure method comprises: setting at least some of the optical elements into the first state or into the second state by the driving method for the spatial light modulator according to the first aspect; and exposing the substrate with a spatial image formed with the exposure light via the optical elements set in the first state or in the second state and via the projection optical system.

A third aspect provides an exposure apparatus for exposing a substrate with exposure light via a projection optical system. This exposure apparatus comprises: a spatial light modulator having an array of optical elements which are arranged on the object plane side of the projection optical system and each of which is controllable so as to guide the exposure light to the projection optical system; and a control device for driving the optical elements of the spatial light modulator; the control device sets the optical elements as follows in accordance with a spatial image formed on the substrate via the projection optical system: the control device sets a plurality of optical elements in a first region into a first state; the control device sets a plurality of optical elements in a second region adjacent in a first direction to the first region into a second state different from the first state; the control device sets a plurality of optical elements arranged in a first boundary region extending in a second direction intersecting with the first direction between the first region and the second region, and at a pitch over a resolution limit of the projection optical system in the second direction, into the first state or into the second state.

A fourth aspect provides a method for forming a pattern for exposure, the method comprising: setting a plurality of optical elements in a first region of a spatial light modulator having an array of optical elements each of which can guide light to a projection optical system, into a first state; setting a plurality of optical elements in a second region adjacent in a first direction to the first region into a second state different from the first state; and setting a plurality of optical elements arranged in a first boundary region extending in a second direction intersecting with the first direction between the first region and the second region, and at a pitch over a resolution limit of the projection optical system in the second direction, into the first state or into the second state.

A fifth aspect provides a method for forming a pattern for exposure with a plurality of sections arranged in a grid pattern, which is used in exposure of a substrate by use of a projection optical system, the method comprising: setting a plurality of sections in a first region out of the plurality of sections into a first state; setting a plurality of sections in a second region adjacent in a first direction to the first region into a second state different from the first state; and setting a plurality of sections arranged in a first boundary region extending in a second direction intersecting with the first direction between the first region and the second region, and at a pitch over a resolution limit of the projection optical system in the second direction, into the first state or into the second state.

A sixth aspect provides a device manufacturing method comprising: forming a pattern of a photosensitive layer on a substrate, using the exposure method of the second aspect or the exposure apparatus of the third aspect; and processing the substrate with the pattern formed thereon.

Effects of the Invention

According to the aspects of the present invention, the spatial light modulator is configured to set the plurality of optical elements arranged at the pitch over the resolution limit of the projection optical system in the second direction in the first boundary region between the first region and the second region, into the first state or into the second state, whereby the position of the image of the boundary part between the first region and the second region can be controlled in accuracy finer than the width of the images of the optical elements in the first direction. Therefore, when the pattern is projected (formed) on an object with the use of the spatial light modulator having the array of optical elements, the pattern can be formed in position accuracy or shape accuracy finer than the width of the images of the optical elements.

BRIEF DESCRIPTION OF DRAWINGS

FIG. 2(A) is an enlarged perspective view showing a part of spatial light modulator 28 in FIG. 1, and FIG. 2(B) a cross-sectional view along the line BB in FIG. 2(A);

FIG. 3(A) is a drawing showing shot areas on a wafer in scanning exposure, and FIG. 3(B) a drawing showing shot areas on a wafer in exposure by the step-and-repeat method;

FIG. 6(A) is a drawing showing an intensity distribution of a spatial image corresponding to the phase distribution of FIG. 5(A), and FIG. 6(B) an enlarged view showing a resist pattern corresponding to the spatial image;

FIG. 8(A) is an enlarged plan view showing an example of a phase distribution of reflected light set in a spatial light modulator of a first modification example, and FIG. 8(B) an enlarged plan view showing a phase distribution equivalent to FIG. 8(A);

DESCRIPTION OF EMBODIMENTS

[First Embodiment]

The first embodiment of the present invention will be described below with reference to FIGS. 1 to 7.

Figure 1:
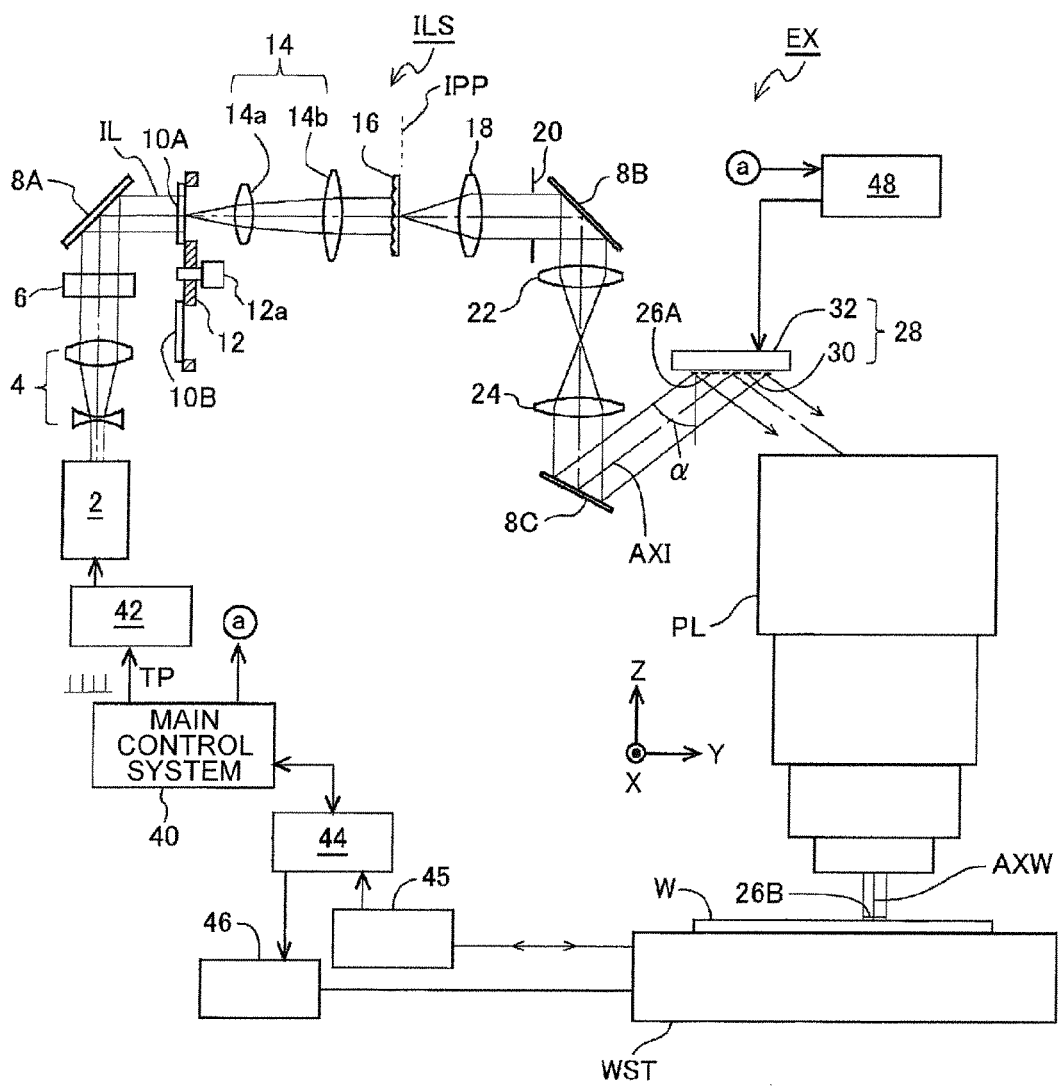
FIG. 1 is a drawing showing a schematic configuration of an exposure apparatus according to a first embodiment.
Figure 4:
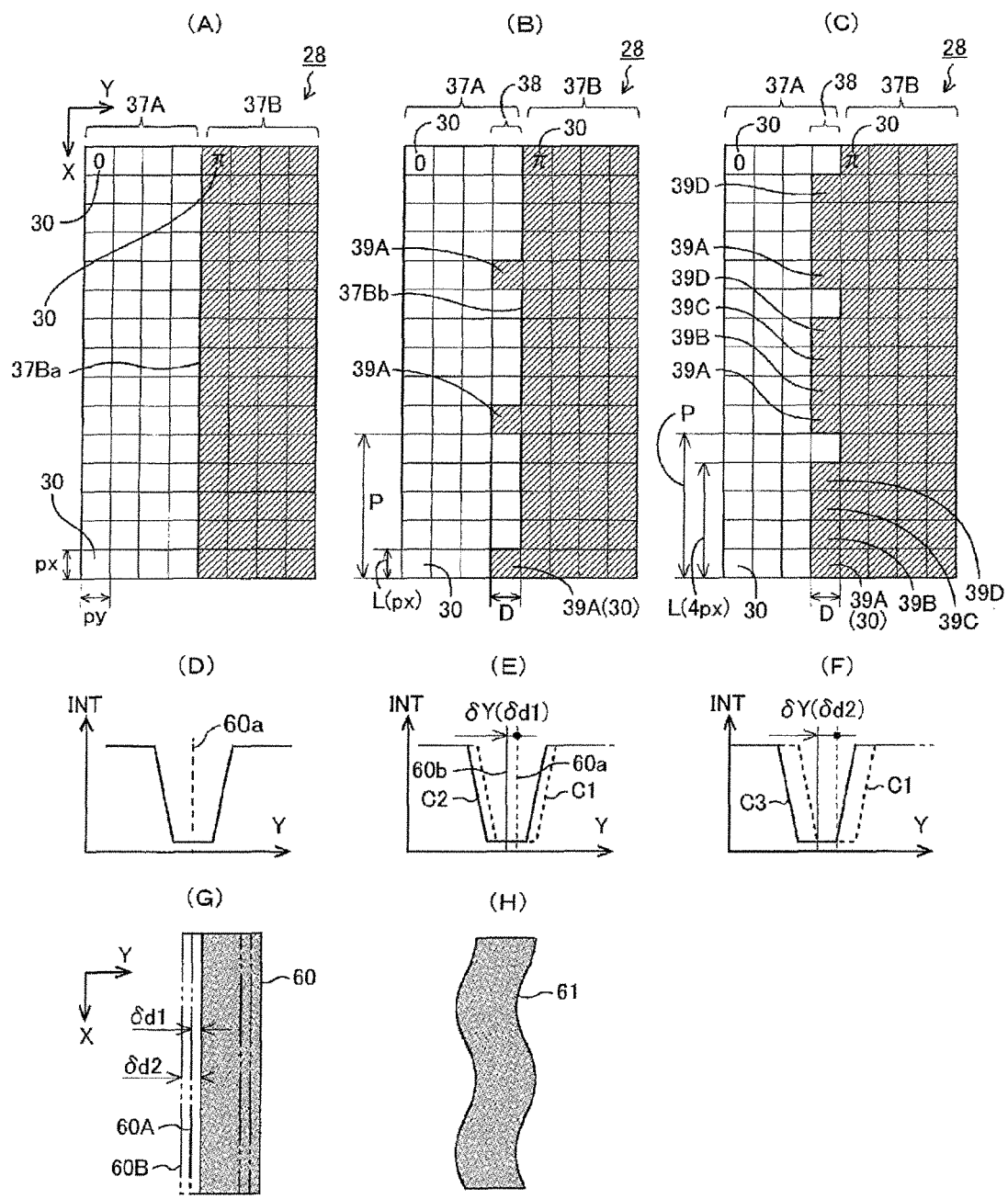
FIGS. 4(A), 4(B), and 4(C) are partially enlarged plan views showing respective examples of phase distributions of reflected light set by the spatial light modulator 28.
FIGS. 4(D), 4(E), and 4(F) are drawings showing intensity distributions of spatial images corresponding to the phase distributions of FIG. 4(A), FIG. 4(B), and FIG. 4(C), respectively.
FIG. 4(G) is an enlarged view showing resist patterns corresponding to the spatial images, and FIG. 4(H) an enlarged view showing a resist pattern of a comparative example.
Figure 5:
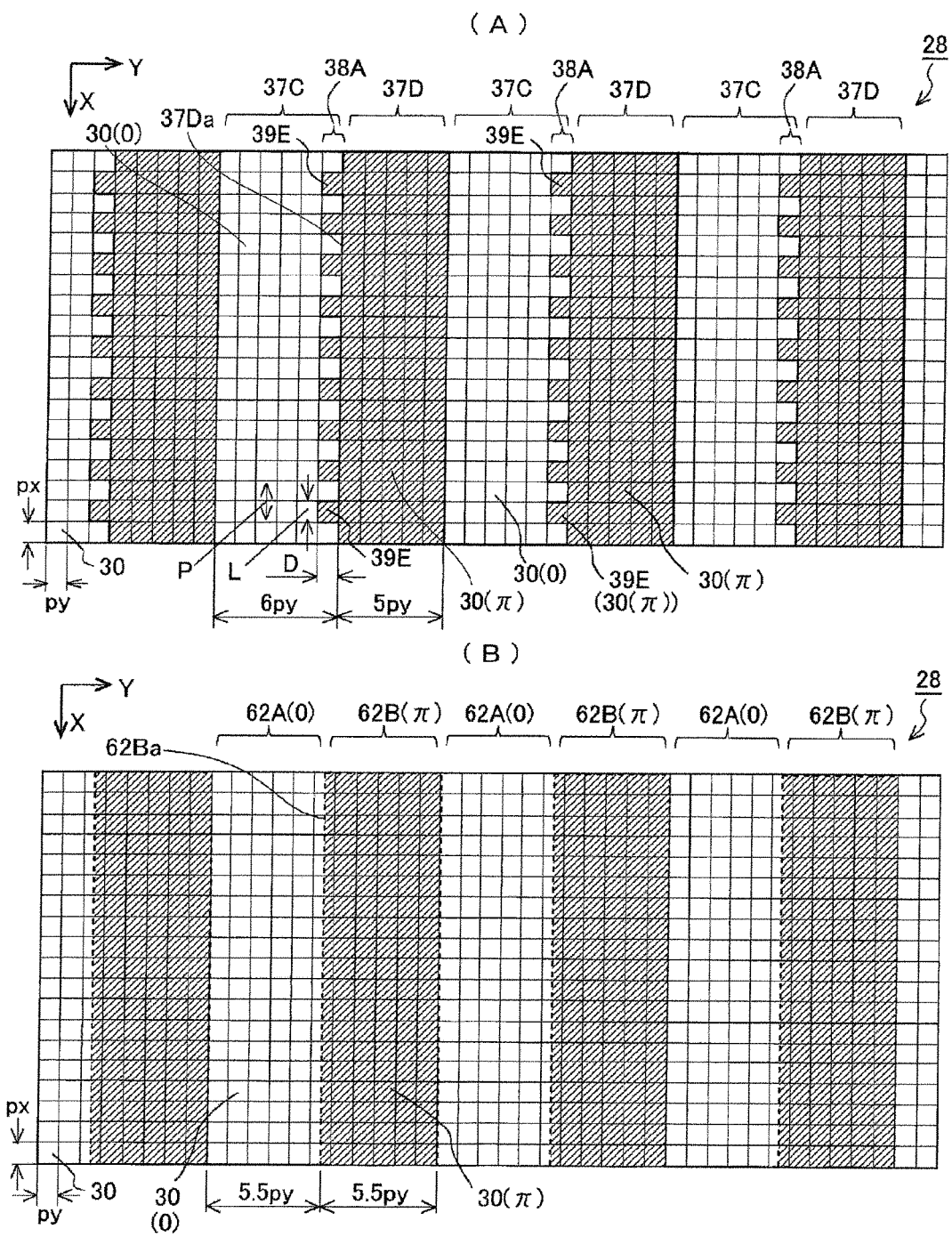
FIG. 5(A) is a partially enlarged plan view showing an example of a phase distribution of reflected light set in the spatial light modulator for forming an L&S pattern, and FIG. 5(B) an enlarged plan view showing a phase distribution equivalent to FIG. 5(A)

FIG. 1 shows a schematic configuration of an exposure apparatus EX of the maskless method according to the present embodiment. In FIG. 1, the exposure apparatus EX has a light source 2 for exposure which emits pulses of light, an illumination optical system ILS which illuminates an illumination target surface with illumination light (exposure light) IL for exposure from the light source 2, a spatial light modulator 28 with a large number of mirror elements 30 which are respective height-variable micromirrors arranged in a two-dimensional array pattern approximately on the illumination target surface or on a surface near it, and a modulation control unit 48 which drives the spatial light modulator 28. Furthermore, the exposure apparatus EX has a projection optical system PL which receives the illumination light IL reflected by a reflective, variable, uneven pattern (mask pattern with a variable phase distribution) generated by the large number of mirror elements 30 and which projects a spatial image (device pattern) created corresponding to the uneven pattern (phase distribution), onto a surface of a wafer W (substrate), a wafer stage WST which performs positioning and movement of the wafer W, a main control system 40 consisting of a computer which generally controls the operation of the overall apparatus, various control systems, and so on.

The description hereinafter will be based on such a coordinate system that in FIG. 1, the Z-axis is set along a direction perpendicular to a bottom surface of the wafer stage WST (a plane parallel to an unrepresented guide surface), the Y-axis is set along a direction parallel to the plane of FIG. 1 in a plane normal to the Z-axis, and the X-axis is set along a direction normal to the plane of FIG. 1. Angles around the X-axis, Y-axis, and Z-axis will also be called angles in θx direction, θy direction, and θz direction, respectively. In the present embodiment, the wafer W is scanned in the Y-direction (scanning direction) during exposure.

The light source 2 used herein is an ArF excimer laser light source which emits pulses of substantially linearly polarized laser light with the wavelength of 193 nm and the pulse width of about 50 ns, at the frequency of approximately 4-6 kHz. The light source 2 also applicable herein can be, for example, a KrF excimer laser light source with the wavelength of 248 nm, a light emitting diode which emits pulsed light, or a solid-state pulsed laser light source which generates a harmonic of laser light output from a YAG laser or a solid-state laser (semiconductor laser or the like). The solid-state pulsed laser light source can emit pulses of laser light, e.g., with the wavelength of 193 nm (or any one of various wavelengths except for it) and with the pulse width of about 1 ns, at the frequency of approximately 1-2 MHz.

In the present embodiment, a power supply 42 is connected to the light source 2. The main control system 40 supplies to the power supply 42, emission trigger pulses TP indicative of timing and light quantity (pulse energy) of pulsed emission. In synchronism with the emission trigger pulses TP, the power supply 42 makes the light source 2 emit pulses at the indicated timing and light quantity.

The illumination light IL consisting of a substantially parallel beam of pulsed laser light with a rectangular sectional shape emitted from the light source 2 travels via a beam expander 4 consisting of a pair of lenses, a polarization control optical system 6 to control a state of polarization of the illumination light IL, and a mirror 8A, to enter a diffractive optical element (diffractive optical element 10A in FIG. 1) selected from a plurality of diffractive optical elements 10A, 10B, and so on, in parallel with the Y-axis. The polarization control optical system 6 is, for example, an optical system that can replaceably set one of a half wave plate to rotate the direction of polarization of the illumination light IL, a quarter wave plate to convert the illumination light IL into circularly polarized light, and a birefringent prism of a wedge shape to convert the illumination light IL into randomly polarized light (unpolarized light).

The diffractive optical elements 10A, 10B, etc. are fixed at approximately equal angle intervals to a peripheral part of a rotary plate 12. The main control system 40 controls the angle of the rotary plate 12 through a drive unit 12a, to set a diffractive optical element selected according to an illumination condition, on the optical path of the illumination light IL. The illumination light IL diffracted by the selected diffractive optical element is guided to an entrance plane of a microlens array 16 by a relay optical system 14 consisting of lenses 14a, 14b. The illumination light IL incident into the microlens array 16 is two-dimensionally divided by a large number of microscopic lens elements forming the microlens array 16, to form a secondary light source (surface light source) on a pupil plane (illumination pupil plane IPP) of the illumination optical system ILS which is a rear focal plane of each lens element.

As an example, the diffractive optical element 10A is provided for normal illumination, the diffractive optical element 10B for small σ illumination to generate illumination light with a small coherence factor (σ value), and other diffractive optical elements (not shown) are also provided for dipolar illumination, for quadrupolar illumination, for annular illumination, and so on. A spatial light modulator having an array of a large number of microscopic mirrors an inclination angle of each of which is variable, may be used instead of the plurality of diffractive optical elements 10A, 10B, etc., and a fly's eye lens or the like can also be used instead of the microlens array 16.

The illumination light IL from the secondary light source formed on the illumination pupil plane IPP travels via a first relay lens 18, a field stop 20, a mirror 8B to bend the optical path into the −Z-direction, a second relay lens 22, a condenser optical system 24, and a mirror 8C, to be incident at an average incidence angle α in the θx direction onto the illumination target surface (a surface where a designed transfer pattern is arranged) parallel to the XY plane. In other words, the optical axis AXI of the illumination optical system ILS intersects at the incidence angle α in the θx direction with the illumination target surface. The incidence angle α is, for example, from several deg (°) to several ten deg. In a power-off condition, reflective surfaces of the large number of mirror elements 30 arranged in the two-dimensional array pattern in the spatial light modulator 28 are arranged on or near the illumination target surface. The illumination optical system ILS is constructed including the optical members from the beam expander 4 to the condenser optical system 24 and the mirror 8C. The illumination light IL from the illumination optical system ILS illuminates a rectangular illumination area 26A elongated in the X-direction on the array of the large number of mirror elements 30 in the spatial light modulator 28, with a substantially uniform illuminance distribution. The large number of mirror elements 30 are arranged at predetermined pitches in the X-direction and in the Y-direction in a rectangular region including the illumination area 26A. The illumination optical system ILS and the spatial light modulator 28 are supported by a frame not shown.

FIG. 2(A) is an enlarged perspective view showing a part of a reflective surface of the spatial light modulator 28 in FIG. 1, and FIG. 2(B) a cross-sectional view along the line BB in FIG. 2(A). In FIG. 2(A), the large number of mirror elements 30 are arranged at the pitches (periods) px and py in the X-direction and in the Y-direction, respectively, on the reflective surface of the spatial light modulator 28. The X-directional and Y-directional widths of the mirror elements 30 can be regarded as being approximately equal to the pitches px and py, respectively. As an example, the mirror elements 30 are square, and the pitches px, py are equal to each other. It is noted herein that the mirror elements 30 may have a rectangular shape or other shape and the pitches px, py may be different from each other.

On the reflective surface, each of the mirror elements 30 is located at a position P(i, j) which is the ith position (i=1, 2, ..., I) in the X-direction and the jth position (j=1, 2, ..., J) in the Y-direction. As an example, the number J of mirror elements 30 arranged in the Y-direction (direction corresponding to the scanning direction of the wafer W) is several hundreds to several thousands, and the number I of mirror elements 30 arranged in the X-direction is several to several ten times the number J. Furthermore, the pitch px (=py) of arrangement of the mirror elements 30 is, for example, approximately 10 μm to 1 μm.

The spatial light modulator 28 has the large number of mirror elements 30, and a base member 32 which supports each of the mirror elements 30 through hinge portions 35 (cf. FIG. 2(B)) each with flexibility (elasticity).

In FIG. 2(B), the base member 32 is composed of a substrate 32A of a flat plate shape which is, for example, comprised of silicon, and an insulating layer 32B of silicon nitride (e.g., $Si_3N_4$) or the like formed on a surface of the substrate 32A. Support portions 34 are formed at predetermined pitches in the X-direction and in the Y-direction on the surface of the base member 32 and a back-side projection of each mirror element 30 is supported through a pair of two-stage hinge portions 35 with flexibility in the Z-direction by elastic deformation, between adjacent Y-directional support portions 34. The support portions 34, hinge portions 35, and mirror elements 30 are integrally formed, for example, of polysilicon. A reflective film 31 comprised of a thin film of metal (e.g., aluminum or the like) to enhance reflectivity is formed on the reflective surface (top surface) of each mirror element 30.

Furthermore, electrodes 36A are formed on the surface of the base member 32 on the bottom side of mirror elements 30 and electrodes 36B are formed on the respective bottom faces of the hinge portions 35 so as to be opposed to the electrodes 36A. Signal lines (not shown) for applying a predetermined voltage between corresponding electrodes 36A, 36B for each mirror element 30 are provided in a matrix on the surface of the base member 32 and on the side faces of the support portions 34. In this case, in a state without application of the voltage between the electrodes 36A, 36B in a power-off condition or in a power-on condition (first state), the reflective surface of the mirror element 30 agrees with a reference plane A1 which is a plane parallel to the XY plane, as indicated by the mirror element 30 at the position P(i, j−1) where an illumination beam IL2 is incident. On the other hand, in a state with application of the predetermined voltage between the electrodes 36A, 36B in the power-on condition (second state), the reflective surface of the mirror element 30 agrees with a plane A2 displaced by a distance d1 in the Z-direction from the reference plane A1 in parallel with the XY plane, as indicated by the mirror element 30 at the position P(i, j) where an illumination beam IL1 is incident. The modulation control unit 48 in FIG. 1 controls the voltage between electrodes 36A, 36B for each mirror element 30 at the position P(i, j), in accordance with information of the phase distribution (uneven pattern) of the illumination light IL set from the main control system 40. Each mirror element 30 is set either in the first state or in the second state.

The spatial light modulator 28 of this microscopic three-dimensional structure can be manufactured by use of the MEMS (Microelectromechanical Systems) technology, for example, as described in Non-Patent Document 1 cited in the Background Art. Since each mirror element 30 of the spatial light modulator 28 needs only to be set in the first state or in the second state by parallel displacement, it is easy to achieve downsizing of the mirror elements 30 and increase in the number of arrangement of mirror elements 30.

In the state in which the reflective surface of each mirror element 30 agrees with the reference plane A1 (the first state), let us define a change amount of the phase of the illumination light IL reflected by the mirror element 30, as a first phase $\delta 1$; in the present embodiment the phase $\delta 1$ is 0°. In the state in which the reflective surface of each mirror element 30 agrees with the plane A2 displaced by the distance d1 from the reference plane A1 (the second state), let us define a change amount of the phase of the illumination light IL reflected by the mirror element 30, as a second phase $\delta 2$; the phase $\delta 2$ is different by 180° ($\pi$ (rad)) from the phase $\delta 1$. Namely, the relations below hold. It is, however, noted that an error of several deg (°) from the below formula is permitted for the phase $\delta 2$, with consideration to manufacturing error of the spatial light modulator 28, driving error by the modulation control unit 48, and so on.

$$\delta 1 = 0° \tag{1A}$$

$$\delta 2 = 180° = \pi(\text{rad}) \tag{1B}$$

In the description hereinafter the phases without unit refer to phases in rad. The second phase $\delta 2$ is defined as a difference between the change amount of the phase of the wavefront of reflected beam B1 indicated by a dashed line with the reflective surface of mirror element 30 at the position P(i, j) agreeing with the reference plane A1 and the change amount of the phase of the wavefront of reflected beam B2 with the reflective surface agreeing with the plane A2 at the distance d1. As an example, where the incidence angle $\alpha$ is 0° and the wavelength of the illumination light IL1 incident to the reflective surfaces of the mirror elements 30 is $\lambda$ ($\lambda$=193 nm herein), the distance d1 is determined as follows.

$$d1 = \lambda/4 \tag{2}$$

In FIG. 2(A), each of the mirror elements 30 in the spatial light modulator 28 is controlled into the first state in which it reflects the incident illumination light IL with a change of 0° in the phase thereof or into the second state in which it reflects the incident illumination light IL with a change of 180° in the phase thereof. In the description below, the mirror element 30 set in the first state will also be called a mirror element of phase 0 and the mirror element 30 set in the second state a mirror element of phase $\pi$.

As an example, at every emission of a predetermined number of pulses of illumination light IL, the main control system 40 supplies to the modulation control unit 48, information of the phase distribution (uneven pattern) of the illumination light IL to be set by the spatial light modulator 28. In accordance therewith, the modulation control unit 48 controls each of the mirror elements 30 in the spatial light modulator 28 to the phase 0 or to the phase $\pi$. A spatial image according to the phase distribution is formed on the surface of the wafer W.

In FIG. 1, the illumination light IL, after reflected by the array of many mirror elements 30 in the illumination area 26A of the spatial light modulator 28, is incident at the average incidence angle $\alpha$ into the projection optical system PL. The projection optical system PL with the optical axis AXW supported by an unrepresented column is a reduction projection optical system which is non-telecentric on the spatial light modulator 28 (object plane) side and telecentric on the wafer W (image plane) side. The projection optical system PL forms a demagnified image of the spatial image according to the phase distribution of the illumination light IL set by the spatial light modulator 28, on an exposure region 26B (which is a region optically conjugate with the illumination area 26A) in one shot area on the wafer W. A projection magnification $\beta$ of the projection optical system PL is, for example, approximately 1/10 to 1/100. In the case where the image-side numerical aperture of the projection optical system PL is NA, the wavelength of the illumination light IL is $\lambda$, and the illumination condition is normal illumination, the resolution Re of the projection optical system PL (the resolution limit represented by a pitch of a periodic pattern or twice a line width) is given as follows.

$$Re = \lambda/NA \quad (3)$$

As an example, the resolution Re is approximately one to several times the width (β·py) of images of the mirror elements 30 in the spatial light modulator 28. For example, where the size of the mirror elements 30 (arrangement pitch) is about several μm and the projection magnification β of the projection optical system PL is about 1/100, the resolution Re is approximately from several ten nm to several times it. The wafer W (substrate) includes, for example, one obtained by coating a surface of a base material of a circular flat plate shape of silicon or SOI (silicon on insulator), with a photoresist (photosensitive material) in the thickness of about several ten nm to 200 nm.

With the use of the projection optical system PL nontelecentric on the object side as in the present embodiment, the reflective surfaces of the large number of mirror elements 30 in the spatial light modulator 28 and the exposure surface of the wafer W (the surface of the photoresist) can be arranged approximately in parallel to each other. Therefore, it is easy to design and manufacture the exposure apparatus.

When the exposure apparatus EX is a liquid immersion type, it is provided with a local liquid immersion device to supply and collect a liquid (e.g., pure water) which transmits the illumination light IL, between an optical member at the tip of the projection optical system PL and the wafer W, for example, as disclosed in U.S. Pat. Published Application No. 2007/242247. In the case of the liquid immersion type, the resolution can be further increased because the numerical aperture NA can be made larger than 1.

In FIG. 1, the wafer W is sucked and held on the top surface of the wafer stage WST through a wafer holder (not shown) and the wafer stage WST is configured to implement step movement in the X-direction and Y-direction on an unillustrated guide surface and movement at a constant speed in the Y-direction. X-directional and Y-directional positions, an angle of rotation in the θz direction, etc. of the wafer stage WST are measured by a laser interferometer 45 and this measurement information is supplied to a stage control system 44. The stage control system 44 controls the position and speed of the wafer stage WST through a driving system 46 such as a linear motor, based on the control information from the main control system 40 and the measurement information from the laser interferometer 45. The apparatus is also provided with an alignment system (not shown) to detect positions of alignment marks on the wafer W, for carrying out alignment of the wafer W.

For carrying out exposure of the wafer W, the basic operation is as follows: the alignment of the wafer W is first carried out and thereafter an illumination condition of the illumination optical system ILS is set. Furthermore, the main control system 40 supplies to the modulation control unit 48, information of a phase distribution corresponding to a pattern to be exposed in each shot area on the wafer W. Then the wafer W is positioned at a scan start position, for example, for carrying out exposure in shot areas SA21, SA22, . . . aligned on a line in the Y-direction on the surface of the wafer W shown in FIG. 3(A). Thereafter, scan is started at a constant speed in the +Y-direction on the wafer W. Arrows in the shot areas SA21 and others in FIG. 3(A) indicate directions of movement of the exposure region 26B relative to the wafer W.

Next, the main control system 40 supplies to the modulation control unit 48, information of a relative position of the shot area SA21 on the wafer W to the exposure region 26B and in accordance with the relative position the modulation control unit 48 retrieves a partial phase distribution as a transfer target and sets the retrieved partial phase distribution in the spatial light modulator 28. Then the main control system 40 supplies the emission trigger pulses TP to the power supply 42, thereby to implement exposure of an intended spatial image according to the Y-directional position in the exposure region 26B on the wafer W. This operation is repeatedly carried out every time the wafer W moves a predetermined distance and before the shot area SA21 has crossed the exposure region 26B.

Thereafter, for exposure of the shot area SA22 adjacent to the shot area SA21 on the wafer W, while the wafer W is kept scanned in the same direction, the main control system 40 supplies the information of the relative position of the shot area SA22 to the exposure region 26B to the modulation control unit 48 and supplies the emission trigger pulses TP to the power supply 42. In this manner, the exposure can be continuously carried out from the shot area SA21 to SA22 by the maskless method. Then, supposing the exposure is shifted to exposure on a line including the shot areas SA31, SA32 adjacent in the X-direction on the wafer W in FIG. 3(A), the wafer stage WST is actuated to implement step movement of the wafer W in the X-direction (non-scanning direction perpendicular to the scanning direction). Then, the scanning direction of the wafer W relative to the exposure region 26B indicated by a dotted line is set to the opposite −Y-direction, and the main control system 40 supplies the information of the relative position of the shot area SA31 or the like to the exposure region 26B to the modulation control unit 48 and supplies the emission trigger pulses TP to the power supply 42. By this operation, the exposure can be continuously carried out from the shot area SA32 to SA31. In this exposure, it is also possible to implement exposure of mutually different spatial images in the shot areas SA21, SA22, and so on. Thereafter, the photoresist of the wafer W is developed to form a resist pattern corresponding to a circuit pattern in each shot area on the wafer W.

The below will describe an operation to form a pattern in position accuracy and/or shape accuracy finer than the width of images of the mirror elements 30 in the spatial light modulator 28, in the exposure apparatus EX of the present embodiment. First, let us consider a case where an isolated line pattern extending in the X-direction is formed on the surface of the wafer W. In this case the illumination condition of the illumination optical system ILS is small a illumination, for example, with the σ value of about 0.05 and the polarization direction of the illumination light IL is set to be the X-direction (longitudinal direction of the line pattern) on the wafer W.

First, it is assumed that the center of the line pattern formed on the surface of the wafer W is located on a boundary line between images of mirror elements 30. In this case, a phase distribution of the array of mirror elements 30 in the spatial light modulator 28 is set, as shown in the partially enlarged plan view of FIG. 4(A), to a distribution in which each mirror element 30 in a rectangular first region 37A including multiple columns (e.g., four or more columns) in the Y-direction and multiple rows (e.g., fifteen or more rows) in the X-direction of mirror elements 30 is in a first state (phase 0) and in which each mirror element 30 in a rectangular second region 37B being adjacent in the Y-direction to the first region 37A and having much the same size as the first region 37A is in a second state (phase π). The X-directional and Y-directional arrangement pitches of mirror elements 30 are px and py (px=py herein). In FIG. 4(A)

and below-described FIG. 4(B) and others, the mirror elements 30 in the second state (phase π) are hatched.

A Y-directional intensity distribution INT of a spatial image projected, for example, onto a positive photoresist layer on the wafer W with the illumination light IL in the phase distribution of FIG. 4(A) comes to have a low level (level lower than a photosensitivity level) in a portion centered on a center line 60a conjugate with a boundary line 37Ba between the first region 37A and the second region 37B in FIG. 4(A) and a high level (level higher than the photosensitivity level) on both sides thereof, as shown in FIG. 4(D). Therefore, after developing the photoresist layer, we obtain a line pattern 60 consisting of a resist pattern elongated in the X-direction with a predetermined width in the Y-direction, as shown in FIG. 4(G).

Next, the center of the line pattern formed on the surface of the wafer W is made shifted in the Y-direction by a width smaller than the width of the images of the mirror elements 30, whereby the center of the line pattern is set in position accuracy finer than the width of the images of mirror elements 30 in the Y-direction. In this case, the phase distribution of the array of mirror elements 30 in the spatial light modulator 28 is such that, as shown in the partially enlarged plan view of FIG. 4(B), first, the mirror elements 30 in the first region 37A are set in the first state (phase 0) and the mirror elements 30 in the second region 37B are set in the second state (phase π). Furthermore, in a boundary region 38 consisting of a column of mirror elements 30 extending in the X-direction between the first region 37A and the second region 37B, each of auxiliary pattern elements 39A consisting of a plurality of mirror elements 30 arranged at a pitch (period) P is set in the second state (phase π).

In FIG. 4(B), the pitch P is an integral multiple, twofold or more, of the X-directional arrangement pitch px of the mirror elements 30, and the Y-directional width D of the boundary region 38 is equal to the Y-directional arrangement pitch py of the mirror elements 30. The Y-directional width D of the boundary region 38 may also be set to an integral multiple, twofold or more, of the pitch py. The X-directional width L of the auxiliary pattern element 39A arranged in one pitch in the boundary region 38 is an integral multiple of the pitch px and, in FIG. 4(B), the width L is px. By using an integer m1 of one or more and an integer m2 larger than the integer m1, the relation between the width L and the pitch P is as follows. In the example of FIG. 4(B), m1=1 and m2=5.

$$L = m1 \cdot px < P = m2 \cdot px \quad (4)$$

In the present embodiment, the images of the auxiliary pattern elements 39A in the boundary region 38 are made not to be resolved in the X-direction. Namely, the intensity distribution of the spatial image formed on the surface of the wafer W is made constant in the X-direction. For this, the arrangement pitch β·P (β is the projection magnification) of the images of the auxiliary pattern elements 39A in the boundary region 38 by the projection optical system PL is set to be finer than the resolution Re of the projection optical system PL represented by formula (3) (the resolution limit expressed by the pitch herein). At this time, the following relation holds using the numerical aperture NA on the image plane side of the projection optical system PL, the wavelength λ of the illumination light IL, and formula (3).

$$\beta \cdot P < \lambda / NA \quad (5A),$$

$$\text{or } P < \lambda / (\beta \cdot NA) \quad (5B)$$

As an example, with λ=193 nm, NA=1.35 (in application of the liquid immersion method), and β=1/100, the right side of formula (5B) becomes 14.2 μm. Therefore, when the arrangement pitch P of the auxiliary pattern elements 39A in the boundary region 38 is set smaller than about 14 μm, ±first-order diffracted beams emitted into ±X-directions from the auxiliary pattern elements 39A are blocked by an aperture stop of the projection optical system PL so as not to contribute to imaging. For example, where the pitch px of the mirror elements 30 is 2.4 μm, the pitch P may be set to five times the pitch px, i.e., 12 μm.

When formula (5A) or (5B) is met, the Y-directional intensity distribution INT of the spatial image projected, for example, onto a positive photoresist layer on the wafer W with the illumination light IL in the phase distribution of FIG. 4(B) becomes a distribution C2 indicated by a solid line in FIG. 4(E). The X-directional intensity distribution of the distribution C2 is uniform. In FIG. 4(E), a distribution C1 indicated by a dotted line is the intensity distribution corresponding to the phase distribution of FIG. 4(A) and a Y-directional center line 60b of the distribution C2 is shifted by δY in the −Y-direction from the center line 60a of the distribution C1. The center line 60b of the distribution C2 corresponds to an image of a boundary line 37Bb of a region including the second region 37B and auxiliary pattern elements 39A in FIG. 4(B).

Using the Y-directional width D of the boundary region 38, the X-directional arrangement pitch P of the auxiliary pattern elements 39A, the X-directional width L of the auxiliary pattern elements 39A, and the projection magnification β in FIG. 4(B), the Y-directional shift amount δY of the center line 60b of the spatial image with respect to the center line 60a is given as follows.

$$\delta Y = \beta \cdot D \cdot L / P \quad (6A)$$

By substituting L and P in formula (4) into formula (6A), setting the width D to py, and using the integers m1, m2 (m1<m2), the shift amount δY becomes (m1/m2) of the width of the images of the mirror elements 30 as below.

$$\delta Y = \beta \cdot py \cdot m1 / m2 \quad (6B)$$

A shift amount δSy on the object plane of the projection optical system PL corresponding to the shift amount δY, i.e., a Y-directional imaginary movement amount of the boundary line 37Ba in FIG. 4(A) on the arrangement plane of the mirror elements 30 is as follows.

$$\delta Sy = D \cdot L / P \quad (6C)$$

On the contrary, when given the Y-directional shift amount δY of the line pattern on the image plane or the movement amount δSy on the object plane, for example, the modification control unit 48 can calculate the X-directional width L of the auxiliary pattern elements 39A in the boundary region 38 corresponding thereto from the below formula as a modification of formula (6A) or (6C). When the right side of formulas (6D) and (6E) below is not an integral multiple of the pitch py (equal to px herein), the width L may be determined to be an integral multiple of the pitch px closest to a value of the right side.

$$L = \delta Y \cdot P / (D \cdot \beta) \quad (6D)$$

$$\text{or } L = \delta Sy \cdot P / D \quad (6E)$$

In the case of FIG. 4(B), since m1=1 and m2=5, the shift amount δY in FIG. 4(E) is calculated from formula (6B) so as to be δY=δd1=β·py/5. Therefore, by developing the photoresist layer exposed with the spatial image in FIG. 4(E), a line pattern 60A is obtained, as shown in FIG. 4(G), as a pattern shifted by δd1 (⅕ of the width of the images of the mirror elements 30) in the −Y-direction with respect to the line pattern 60 corresponding to the phase distribution of FIG. 4(A).

The Y-directional shift amount of the line pattern can be increased by increasing the X-directional width L in one pitch of the auxiliary pattern elements 39A-39D in the phase π arranged at the pitch P in the boundary region 38, as shown in FIG. 4(C). Since in FIG. 4(C) the number of auxiliary pattern elements 39A-39D in one pitch is 4 (m1=4), the intensity distribution INT of the spatial image on the wafer W corresponding the phase distribution of FIG. 4(C) becomes a distribution C3 shifted by δd2 (=β·4py/5) in the −Y-direction with respect to the distribution C1, as indicated by distribution C3 in FIG. 4(F). Therefore, by developing the photoresist layer exposed with the spatial image in FIG. 4(F), a line pattern 60B is obtained, as shown in FIG. 4(G), as a pattern shifted by δd2 (⅘ of the width of the images of the mirror elements 30) in the −Y-direction with respect to the line pattern 60.

In the present embodiment, as described above, the position of the isolated linear spatial image, or the line pattern of the resist pattern can be set in position accuracy finer than the width of the images of the mirror elements 30.

Let us consider herein a state in which the X-directional arrangement pitch P of the auxiliary pattern elements 39A or the like in the boundary region 38 does not satisfy formula (5B), i.e., a state in which the images of the auxiliary pattern elements 39A or the like are resolved in the X-direction by the projection optical system PL. In this case, the line pattern obtained eventually varies at the pitch β·P in the X-direction as shown in FIG. 4(H), which is not preferred.

Next, let us consider a case where a line-and-space pattern (which will be referred to hereinafter as L&S pattern) in which line patterns extending in the X-direction are arranged at a pitch of a non-integral multiple of the width of the images of the mirror elements 30 in the Y-direction is formed on the surface of the wafer W. The illumination condition is set as small σ illumination, for example, with the σ value of about 0.05 in this case as well and the polarization condition is set so that the polarization direction of the illumination light IL is the X-direction (the longitudinal direction of the line patterns) on the wafer W.

First, as shown in the partially enlarged plan view of FIG. 5(A), the arrayed mirror elements 30 in the spatial light modulator 28 are separated into a plurality of first regions 37C each including six columns in the Y-direction and multiple rows (e.g., nineteen or more rows) in the X-direction of mirror elements 30, and a plurality of second regions 37D each including five columns in the Y-direction and multiple rows (e.g., nineteen or more rows) in the X-direction of mirror elements 30, which are arranged between the first regions 37C. Then the phase distribution of the mirror elements 30 is set to a distribution in which the mirror elements 30 in the first regions 37C are in the first state (phase 0) and in which the mirror elements 30 in the second regions 37D are in the second state (phase π).

Furthermore, in boundary regions 38A each consisting of a column of mirror elements 30 extending in the X-direction between the first region 37C and the second region 37D, each of auxiliary pattern elements 39E consisting of a plurality of mirror elements 30 arranged at the pitch (period) P is set in the second state (phase π). The X-directional width L of the auxiliary pattern elements 39E arranged in one pitch in the boundary regions 38A is an integral multiple of the pitch px and, using the integers m1 and m2 (m1<m2) of 1 or more, the width L and the pitch P satisfy the aforementioned relation of formula (4). In the example of FIG. 5(A), m=1 and m2=2, and then L=px and P=2px.

In this case as well, in order to prevent the images of the auxiliary pattern elements 39E in the boundary regions 38A from being resolved in the X-direction, the arrangement pitch β·P (β is the projection magnification) of the images of the auxiliary pattern elements 39E by the projection optical system PL is set to be finer than the resolution Re of the projection optical system PL represented by formula (3). In other words, the aforementioned formulas (5A) and (5B) are valid.

Using the Y-directional width D of the boundary regions 38A, the X-directional arrangement pitch P of the auxiliary pattern elements 39E, the X-directional width L of the auxiliary pattern elements 39E, and the projection magnification β in FIG. 5(A), the Y-directional movement amount δY of images of boundary lines 37Da between the first regions 37C and the second regions 37D is represented by the aforementioned formula (6A). Since in the example of FIG. 5(A), P=2px, L=px, and D=py (=px), the movement amount δY of the images of the boundary lines 37Da and the movement amount δSy of the boundary lines 37Da on the arrangement plane of the mirror elements 30 corresponding to the movement amount δY are obtained as follows.

$$\delta Y = \beta \cdot py/2 \quad (7A),$$

$$\delta Sy = py/2 = 0.5py \quad (7B)$$

Therefore, as to the projection optical system PL, the phase distribution of the illumination light IL set by the spatial light modulator 28 in FIG. 5(A) becomes equivalent to a phase distribution set imaginarily by the spatial light modulator 28 as shown in FIG. 5(B). In FIG. 5(B), the phase is 0 in the plurality of first regions 62A elongated in the X-direction with the Y-directional width of 5.5py and the phase is π in the second regions 62B elongated in the X-direction with the Y-directional width of 5.5py as arranged between the plurality of first regions 62A. The boundary line 62Ba between first region 62A and second region 62B passes a center of a column of mirror elements 30 arranged in the X-direction. The Y-directional intensity distribution INT of the spatial image on the surface of the wafer W corresponding to the phase distribution of FIG. 5(A) varies in a sinusoidal shape with the Y-directional pitch of β·5.5py, as shown in FIG. 6(A). By developing the photoresist layer exposed with the spatial image, as shown in FIG. 6(B), an L&S pattern 63 is formed as a pattern in which line patterns 63L of the photoresist elongated in the X-direction are arranged at the pitch of β·5.5py in the Y-direction. As an example, where the pitch py of the mirror elements 30 is 2 μm and the projection magnification β is 1/100, the pitch of the L&S pattern 63 is found to be 110 nm (the half pitch thereof is 55 nm).

In FIG. 6(A), the position where the intensity distribution INT reaches the smallest level (center line 63a) corresponds to the position of a center line 63a of each line pattern 63L in FIG. 6(B). The center line 63a of each line pattern 63L is also an image of the boundary line 37Da in FIG. 5(A) (or the boundary line 62Ba in FIG. 5(B)) and the boundary line between the second region 37D and the first region 37C. According to this example, by providing the boundary regions 38A in FIG. 5(A) in the array of mirror elements 30 in the spatial light modulator 28, the L&S pattern 63 can be formed as a pattern in which the pitch is a non-integral multiple of the width (β·py) of the images of the mirror elements 30, on the wafer W. Therefore, when the accuracy of the pitch of the L&S pattern 63 is assumed to be one of shape accuracies, the periodic pattern can be formed in the shape accuracy finer than the width of the images of the mirror elements 30 in the spatial light modulator 28.

Figure 7:
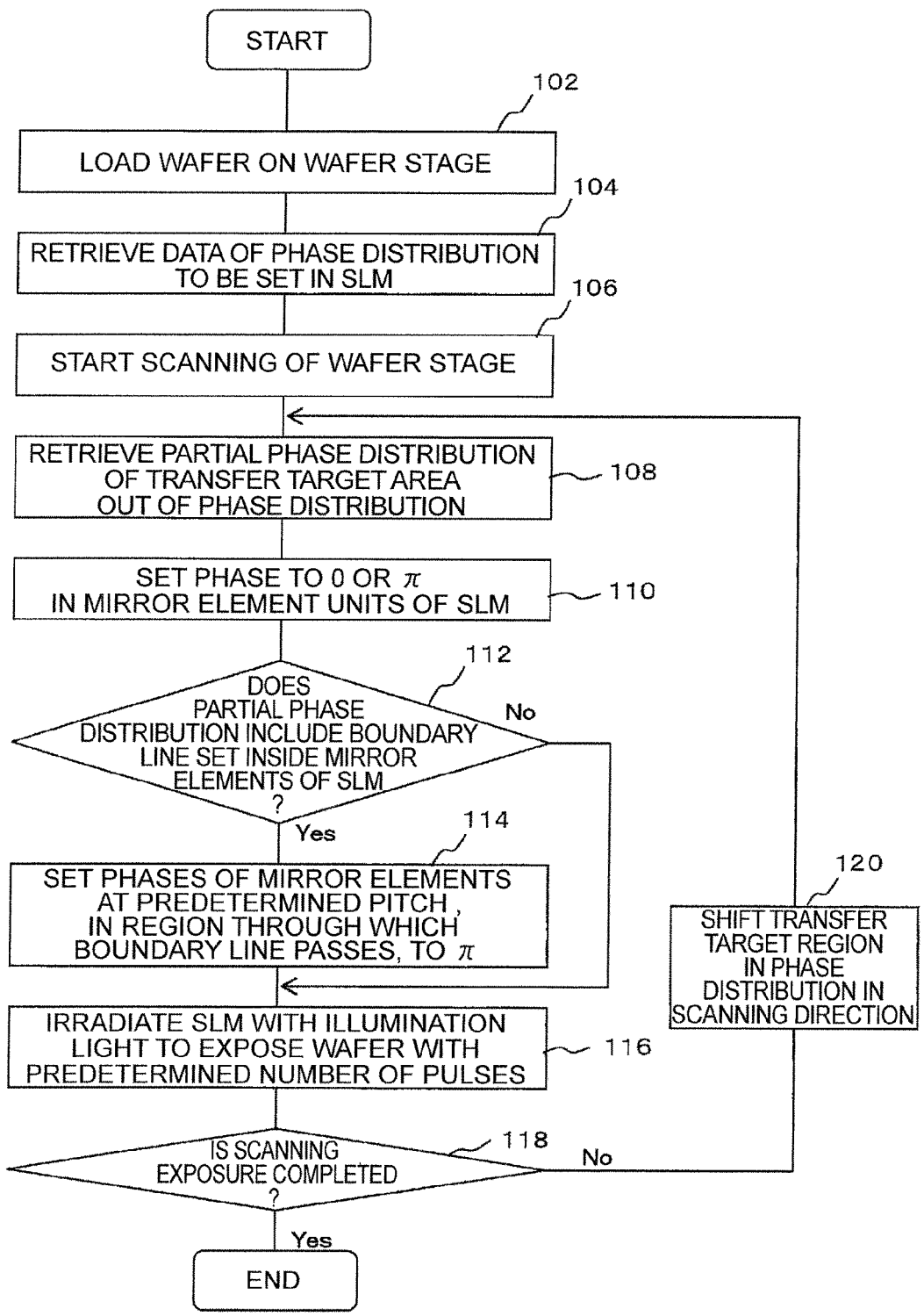
FIG. 7 is a flowchart showing an example of an operation to implement exposure while driving the spatial light modulator.

The below will describe an example of an exposure method including a driving method for the spatial light modulator 28, to form a pattern in position accuracy and/or shape accuracy finer than the width of the images of the mirror elements 30 in the spatial light modulator 28, in the exposure apparatus EX in FIG. 1, with reference to the flowchart of FIG. 7. First, in step 102 in FIG. 7, the wafer W coated with a photoresist is loaded on the wafer stage WST in the exposure apparatus EX and in next step 104, the main control system 40 retrieves from an exposure data file, information about the overall phase distribution to be set in the spatial light modulator (SLM) 28, the Y-directional width D of the boundary region 38 in FIG. 4(B) or the boundary regions 38A in FIG. 5(A), and the X-directional arrangement pitch P of the auxiliary pattern elements 39A or the like (39E) in the boundary region 38 (38A), and supplies the retrieved information to the modulation control unit 48. In next step 106 the wafer stage WST is moved to start Y-directional scanning and, when a leading part of a shot area as an exposure target on the wafer W reaches a portion as the exposure region 26B, the main control system supplies information of a relative position of the shot area to the modulation control unit 48.

In next step 108, the modulation control unit 48 retrieves a partial phase distribution of a region to be transferred to the exposure region 26B (transfer target region), from the data of the overall phase distribution. In next step 110, the modulation control unit 48 sets the mirror elements 30 into the first state (phase 0) or into the second state (phase π) corresponding to the partial phase distribution, in units of the mirror elements 30 in the spatial light modulator 28. Through this step, when the phase distribution of the transfer target is FIG. 4(B), the mirror elements 30 in the first region 37A are set in the phase 0 and the mirror elements 30 in the second region 37B in the phase π. When the transfer target phase distribution is FIG. 5(A), the mirror elements 30 in the first regions 37C are set in the phase 0 and the mirror elements 30 in the second regions 37D in the phase π.

In next step 112, the modulation control unit 48 determines whether the partial phase distribution includes a boundary line (a boundary line between 0 and π) set inside the width of the mirror elements 30, and without any boundary line, the operation moves to step 116. On the other hand, when there is a boundary line set inside the width of the mirror elements 30, the operation goes to step 114. In step 114, the modulation control unit 48 calculates the X-directional width L of the auxiliary pattern elements 39A or the like (39E) in the boundary region 38 (38A) from formula (6E), using the shift amount δSy of the boundary line from the boundary part between the mirror elements 30, and the predetermined width D of the boundary region 38 (38A) and arrangement pitch P, in the region where the boundary line passes (the boundary region 38 in FIG. 4(B) or the boundary regions 38A in FIG. 5(A)). Furthermore, the modulation control unit 48 sets the mirror elements 30 (auxiliary pattern elements 39A or the like or 39E) with the width L arranged at the pitch P in the X-direction, into the second state (phase π), in the boundary region 38 (38A). It is noted that the width L may be calculated from formula (6D), using the movement amount δY on the image plane, instead of the shift amount δSy.

In next step 116, the main control system 40 supplies a predetermined number of pulses of illumination light IL to the spatial light modulator 28 through the illumination optical system ILS from the light source 2. This results in exposing the wafer W with the spatial image corresponding to the phase distribution set in the spatial light modulator 28. If it is determined in next step 118 that the scanning exposure is not completed, the operation moves to step 120, in which the main control system 40 supplies the updated relative position information of an exposure target shot area to the exposure region 26B. In accordance therewith, the modulation control unit 48 shifts the transfer target region in the overall phase distribution in the direction corresponding to the scanning direction. Thereafter, the operation returns to step 108 and then the steps 108 to 116 are carried out to expose the wafer W with the spatial image corresponding to the partial phase distribution in the shifted transfer target region. This exposure operation is continued until it is determined in step 118 that the scanning exposure is completed.

According to the present embodiment, as described above, the isolated linear spatial image, or the spatial image of the L&S pattern can be formed each by the maskless method in the position accuracy or the shape accuracy finer than the width of the images of the mirror elements 30. Therefore, a variety of patterns (spatial images) can be formed with high accuracy on the surface of the wafer W.

The effects and others of the present embodiment are as described below.

(1) The exposure apparatus EX of the present embodiment has the spatial light modulator 28. The driving method for the spatial light modulator 28 by the modulation control unit 48 is the method for driving the spatial light modulator 28 having the array of mirror elements 30 (optical elements) each of which can guide the illumination light IL to the projection optical system PL, the driving method having the step 110 of setting the mirror elements 30 in the first region 37A, 37C into the first state (phase 0) and setting the mirror elements 30 in the second region 37B, 37D adjacent in the Y-direction (first direction) to the first region 37A, 37C into the second state (phase π). Furthermore, the driving method has the step 114 of setting the mirror elements 30 (auxiliary pattern elements 39A-39D, 39E) arranged at the pitch over the resolution limit of the projection optical system PL in the X-direction, in the boundary region 38, 38A (first boundary region) extending in the X-direction (second direction) perpendicular to the Y-direction between the first region 37A, 37C and the second region 37B, 37D, into the second state (phase π). This driving method for the spatial light modulator 28 is also a method for generating a pattern for exposure. The array of mirror elements 30 (optical elements) in the spatial light modulator 28 can be regarded as a plurality of sections arranged in a grid pattern, and the mirror elements 30 in the spatial light modulator 28 set in the first state (phase 0) and in the second state (phase π) can be regarded as a pattern for exposure.

The exposure apparatus EX is the exposure apparatus for exposing the wafer W (substrate) with the illumination light IL (exposure light) via the projection optical system PL, which has the spatial light modulator 28 having the array of mirror elements 30 (optical elements) which are arranged on the object plane side of the projection optical system PL and each of which is controllable so as to guide the illumination light IL to the projection optical system PL, and the modulation control unit 48 (control device) for driving the mirror elements 30 in the spatial light modulator 28. In accordance with the spatial image to be formed on the surface of the wafer W via the projection optical system PL, the modulation control unit 48 sets the mirror elements 30 in the first region 37A, 37C into the first state (phase 0), sets the mirror elements 30 in the second region 37B, 37D adjacent in the Y-direction to the first region 37A, 37C into the second state (phase π), and sets the mirror elements 30 arranged at the pitch over the resolution limit of the projection optical system PL in the boundary region 38, 38A (first boundary region) extending in the X-direction between the first region 37A, 37C and the second region 37B, 37D, into the second state (phase π).

According to the present embodiment, the optical elements 30 (auxiliary pattern elements 39A-39D, 39E) arranged at the pitch over the resolution limit of the projection optical system PL in the X-direction in the boundary region 38, 38A are set into the second state in the spatial light modulator 28, whereby the position of the image of the boundary part (boundary line 37Bb, 37Da) between the first region 37A, 37C and the second region 37B, 37D can be controlled in the accuracy finer than the width of the images of the mirror elements 30 (which is the same as the pitch py in the present embodiment) in the Y-direction. Therefore, in projecting (forming) the pattern on the wafer W with the use of the spatial light modulator 28, the line pattern 60A or the L&S pattern 63 can be formed in the position accuracy or the shape accuracy finer than the width of the images of the mirror elements 30.

It is also possible to carry out step 110 and step 114 substantially at the same time. The first region 37A or the like and the second region 37B or the like may be adjacent to each other in the X-direction. In this case, the boundary region 38 becomes a long region elongated in the Y-direction.

(2) Since the spatial light modulator 28 has the mirror elements 30 (reflective elements) as optical elements, the efficiency of utilization of the illumination light IL is high. It is, however, also possible to use a transmissive spatial light modulator in which each of individual optical elements changes the phase of transmitted light by a predetermined phase $\phi 1$ or ($\phi 1+180°$), instead of the spatial light modulator 28. Examples of such optical elements include electro-optical elements, liquid crystal cells, or the like to vary the refractive index depending on voltage.

(3) The pattern (the line pattern 60 and the L&S pattern 63 or the spatial images corresponding thereto) formed on the image plane via the projection optical system PL has the boundary pattern portion (center line 60b, 63a) corresponding to the boundary part (boundary line 37Bb, 37Da) between the first region 37A, 37C and the second region 37B, 37D and in the present embodiment, the states of the mirror elements 30 in the boundary region 38, 38A extending in the X-direction are changed into the first state or into the second state, thereby to displace the boundary pattern portion (center line 60b, 63a) in the Y-direction (direction corresponding to the first direction). In this case, the Y-directional movement amount δY of the boundary pattern portion can be readily controlled by simply adjusting the width L of the mirror elements 30 (auxiliary pattern elements 39A, 39E) arranged at the pitch P in the boundary region 38, 38A and subjected to the state change.

(4) The exposure method of the exposure apparatus EX in the present embodiment is the exposure method for exposing the wafer W (substrate) with the illumination light IL (exposure light) via the spatial light modulator 28 having the array of mirror elements 30 and via the projection optical system PL, the exposure method having the steps 110, 114 of setting at least some of the mirror elements 30 (mirror elements 30 in the illumination region 26A) into the first state or into the second state by the aforementioned driving method for the spatial light modulator 28, and the step 116 of exposing the wafer W with the spatial image formed with the illumination light IL via the mirror elements 30 set in the first state or in the second state and via the projection optical system PL.

According to the exposure method or the exposure apparatus EX, the pattern (spatial image) can be formed in the accuracy finer than the width of the images of the mirror elements 30 and therefore a finer and more complicated pattern can be formed by the maskless method.

Each mirror element 30 in the spatial light modulator 28 may be configured so that it can be set in a plurality of states including a third state or the like except for the first state and the second state.

(5) The illumination light IL from the illumination optical system ILS is obliquely incident approximately at the incidence angle α to the mirror elements 30 (reflective elements) and the reflected light from the mirror elements 30 is incident to the projection optical system PL so as to intersect with the optical axis AXW of the projection optical system PL. Therefore, the projection optical system PL is non-telecentric on the object plane side and for this reason, the whole of the reflected light from the spatial light modulator 28 can be guided via the projection optical system PL onto the wafer W, achieving high efficiency of utilization of the illumination light IL. Furthermore, the polarization state of the illumination light IL set by the polarization control optical system 6 can be accurately reproduced on the surface of the wafer W.

(6) The mirror elements 30 are provided in the rectangular region the longitudinal direction of which is the X-direction (third direction), the exposure apparatus EX has the wafer stage WST (substrate stage) for moving the wafer W in the scanning direction corresponding to the Y-direction (fourth direction) perpendicular to the X-direction on the image plane of the projection optical system PL, and the modulation control unit 48 moves the pattern (phase distribution) formed by the mirror elements 30, in the Y-direction in accordance with the movement of the wafer W by the wafer stage WST. This allows efficient exposure over the entire surface of the wafer W.

The above embodiment can be modified as described below.

In the foregoing embodiment, the boundary region 38, 38A is provided only between the first region 37A, 37C and the second region 37B, 37C in the array of mirror elements 30 in the spatial light modulator 28. However, as shown by a spatial light modulator 28A of a first modification example in FIG. 8(A), the boundary regions may be provided at both ends of second region 37H in the array of mirror elements 30. In FIGS. 8(A) and 8(B), the portions corresponding to those in FIGS. 5(A) and 5(B) are denoted by the same reference signs, without detailed description thereof. The spatial light modulator 28A in FIG. 8(A) is different only in the size of the mirror elements 30 from the spatial light modulator 28 in FIG. 5(A), and the spatial light modulator 28A is set on the object plane side of the projection optical system PL, instead of the spatial light modulator 28 in FIG. 1.

FIG. 8(A) is a partially enlarged plan view showing a phase distribution of the illumination light IL set in the spatial light modulator 28A of the first modification example. In FIG. 8(A), the array of mirror elements 30 in the spatial light modulator 28A is periodically divided in the Y-direction into a first region 37G including four columns in the Y-direction and multiple rows (e.g., thirteen or more rows, which also applies similarly to regions below) in the X-direction of mirror elements 30, a second region 37H including three columns in the Y-direction and multiple rows in the X-direction of mirror elements 30, a third region 37I including four columns in the Y-direction and multiple rows in the X-direction of mirror elements 30, a fourth region 37J including three columns in the Y-direction and multiple rows in the X-direction of mirror elements 30, and a fifth region 37E including four columns in the Y-direction and multiple rows in the X-direction of mirror elements 30, which are sequentially arranged on the +Y-direction side of the first region 37G, and a sixth region 37F arranged on the −Y-direction side of the first region 37G and including four columns in the Y-direction and multiple rows in the X-direction of mirror elements 30. The X-directional and Y-directional arrangement pitches of the mirror elements 30 are defined as px and py.

At the beginning, each of the mirror elements 30 in the sixth region 37F, the second region 37H, and the fourth region 37J is set into the first state (phase 0) and each of the mirror elements 30 in the first region 37G, the third region 37I, and the fifth region 37E into the second state (phase π). Furthermore, auxiliary pattern elements 39F (mirror elements 30) with the width L1 (=px) arranged at the pitch P1 (=3px) in the X-direction in a boundary region 38B with the width D1 (=py) extending in the X-direction between the fifth region 37E and the sixth region 37F are set into the second state (phase π) and auxiliary pattern elements 39G, 39H with the width L2 (=2px) arranged at the pitch P2 (=3px) in the X-direction in a boundary region 38C (first boundary region) with the width D2 (=py) extending in the X-direction between the first region 37G and the second region 37H are set into the second state (phase π).

Auxiliary pattern elements 39G, 39H with the width L2 arranged at the pitch P2 in the X-direction in a boundary region 38D (second boundary region) with the width D2 extending in the X-direction between the second region 37H and the third region 37I are set into the second state (phase π) and auxiliary pattern elements 39I with the width L1 arranged at the pitch P1 in the X-direction in a boundary region 38E with the width D1 extending in the X-direction between the fourth region 37J and the fifth region 37E are set into the second state (phase π). The pitch of the auxiliary pattern elements 39G or the like in the boundary region 38C may be different from the pitch of the auxiliary pattern elements 39G or the like in the boundary region 38D. In this modification example as well, the pitches P1, P2 are finer than the resolution limit of the projection optical system PL and the substantial movement amount δSy1 in the +Y-direction and −Y-direction of the boundary line in the boundary regions 38B and 38E is obtained as below from a formula resulting from replacement of the widths D, L and the pitch P by the widths D1, L1 and the pitch P1, respectively, in formula (6C).

$$\delta Sy1 = D1 \cdot L1/P1 = py/3 \quad (8A)$$

The substantial movement amount δSy2 in the +Y-direction and −Y-direction of the boundary line in the boundary regions 38C and 38D is obtained as below from a formula resulting from replacement of the widths D, L and the pitch P by the widths D2, L2 and the pitch P2, respectively, in formula (6C).

$$\delta Sy2 = D2 \cdot L2/P2 = 2py/3 \quad (8B)$$

As a result, the phase distribution of FIG. 8(A) becomes equivalent to a phase distribution in which the phase becomes 0 in first regions 62C with the Y-directional width of (3+⅔)py and in which the phase becomes π in second regions 62D with the Y-directional width of (3+⅔)py adjacent in the Y-direction to the first regions 62C. In the description hereinbelow, the arrangement pitch py of the mirror elements 30 in FIG. 8(A) will be denoted by py1, for convenience' sake of description. At this time, the Y-directional intensity distribution INT of the spatial image on the surface of the wafer W corresponding to the phase distribution of FIG. 8(B) varies in a sinusoidal shape with the Y-directional pitch of β·(3+⅔)py1 (β is the projection magnification) as shown in FIG. 6(A). By developing the photoresist layer exposed with the spatial image, as shown in FIG. 6(B), the L&S pattern 63 is formed in a configuration wherein the line patterns 63L of the photoresist elongated in the X-direction are arranged at the pitch β·(3+⅔)py1 in the Y-direction. As an example, where the pitch py1 of the mirror elements 30 in the spatial light modulator 28A in FIG. 8(A) is 3 μm and the projection magnification P is 1/100, the pitch of the L&S pattern 63 becomes 110 nm (the half pitch is 55 nm), which is equivalent to the case where the pitch py of the mirror elements 30 in the example of FIG. 5(A) is 2 μm.

In this manner, the L&S pattern can also be formed at the pitch of a non-integral multiple of the width of the images of the mirror elements 30 on the surface of the wafer W, by setting the auxiliary pattern elements 39H, 39G each arranged at the X-directional pitch P2 in the width L2 in the boundary regions 38C, 38D on both sides in the ±Y-directions of the second region 37H in the spatial light modulator 28A in FIG. 8(A), into the second state (phase π).

Next, the foregoing embodiment involves continuously moving the wafer W to implement scanning exposure of the wafer W. Besides it, as shown in FIG. 3(B), each shot area (e.g., SA21) on the wafer W may be divided into a plurality of partial regions SB1-SB5 or the like in the Y-direction and when the partial region SB1 or the like arrives at the exposure region 26B of the projection optical system PL, a predetermined number of pulses of the illumination light IL are emitted to expose the partial region SB1 or the like with the reflected light from the array of mirror elements 30 in the spatial light modulator 28. Thereafter, the wafer W is subjected to step movement in the Y-direction and when the next partial region SB2 or the like arrives at the exposure region 26B, the exposure is carried out in the same manner in the partial region SB2 or the like. This method is substantially the step-and-repeat method, but mutually different patterns are exposed in the partial regions SB1-SB5 or the like.

Next, the phase of the illumination light IL is changed by the first phase or the second phase by parallel displacement of the mirror elements 30 in the spatial light modulator 28, 28A in the above embodiment. However, for example, in FIG. 1, the spatial light modulator 28 may be replaced by a spatial light modulator having an array of mirror elements (reflective elements) an inclination angle of each of which is variable, for example, as disclosed in U.S. Pat. No. 5,312, 513 or U.S. Pat. No. 6,885,493.

When the spatial light modulator of this inclination angle varying method is used, the first state of the mirror elements is a state in which the illumination light from the illumination optical system ILS is guided into the projection optical system PL (a state to produce bright portions) and the second state of the mirror elements a state in which the illumination light from the illumination optical system ILS is not entered into the projection optical system PL (a state to produce dark portions). In this case as well, the pattern can be formed in the position accuracy or the shape accuracy finer than the width of the images of the mirror elements in the Y-direction, by setting the states of the mirror elements arranged in the pitch finer than the resolution limit of the projection optical system PL, for example, in the boundary region extending in the X-direction between the first region and the second region in the array of mirror elements, into the first state or into the second state.

Figure 9:
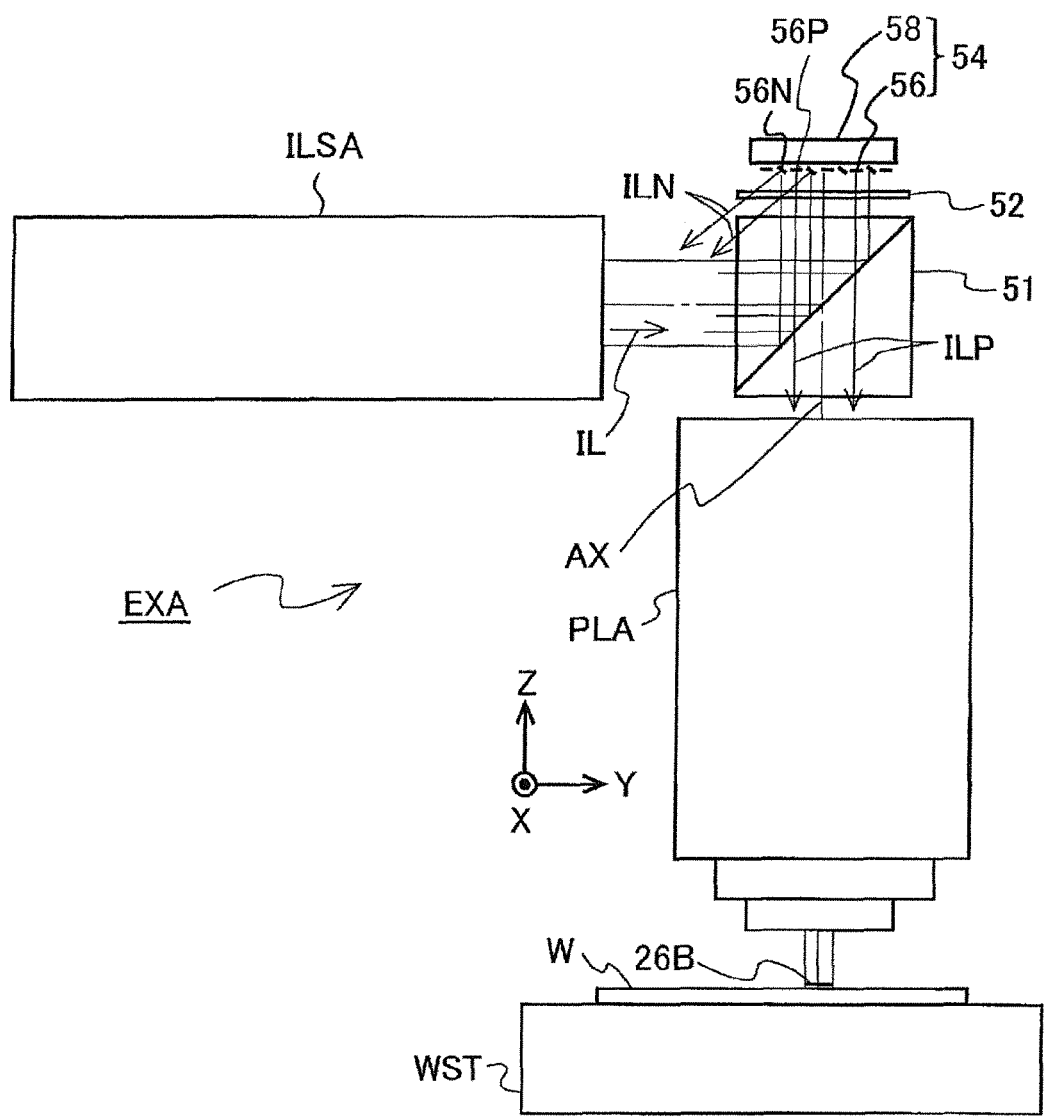
FIG. 9 is a drawing showing a schematic configuration of an exposure apparatus of a second modification example.

Next, the foregoing embodiment uses the projection optical system PL which is non-telecentric on the object side. Besides it, it is also possible to use a projection optical system PLA bitelecentric on the object side and on the image plane side, as shown by an exposure apparatus EXA of a second modification example in FIG. 9. In FIG. 9, the exposure apparatus EXA has a light source (not shown), an illumination optical system ILSA which generates S-polarized illumination light IL approximately in the +Y-direction with use of laser light from the light source, a polarization beam splitter 51 which reflects the illumination light IL into the +Z-direction, a quarter wave plate 52 which converts the illumination light IL from the polarization beam splitter 51 into circularly polarized light, a spatial light modulator 54 which has a two-dimensional array of a large number of mirror elements 56 with a variable inclination angle for reflecting the circularly polarized illumination light IL into the −Z-direction or into the directions other than it, and a base member 58 for supporting the array, and a projection optical system PLA which receives the illumination light IL having passed through the quarter wave plate 52 and the polarization beam splitter 51 after having been reflected by the mirror elements 56 and which projects a spatial image (pattern) onto the exposure region 26B on the surface of the wafer W. The illumination optical system ILSA is an optical system obtained by excluding the mirrors 8B, 8C from the illumination optical system ILS in FIG. 1. The pattern can be formed on the wafer W by the maskless method using a combination of mirror elements 56P in a first state (a state in which reflected light is guided into the projection optical system PL) and mirror elements 56N in a second state (a state in which the reflected light is not entered into the projection optical system PL) among the mirror elements 56.

In this second modification example as well, the pattern can be formed in the position accuracy or the shape accuracy finer than the width (pitch) of the images of the mirror elements 56 in the Y-direction, by setting the states of the mirror elements 56 arranged in the pitch finer than the resolution limit of the projection optical system PL, for example, in the boundary region extending in the X-direction between the first region and the second region in the array of mirror elements 56, into the first state or into the second state. Since this exposure apparatus EXA of the second modification example allows use of the bitelecentric projection optical system PLA, the configuration of the exposure apparatus can be simplified.

In this second modification example, it is also possible to use the spatial light modulator 28 or the like of the phase variable type in FIG. 1, as the spatial light modulator 54.

If the utilization efficiency of the illumination light IL is allowed to decrease to half, an ordinary beam splitter may be used instead of the polarization beam splitter 51, without the quarter wave plate 52. In this case, polarized illumination is available.

It is also possible to use a rod type integrator as an internal reflection type optical integrator, instead of the microlens array 16 as a wavefront division type integrator in FIG. 1.

[Second Embodiment]

Figure 10:
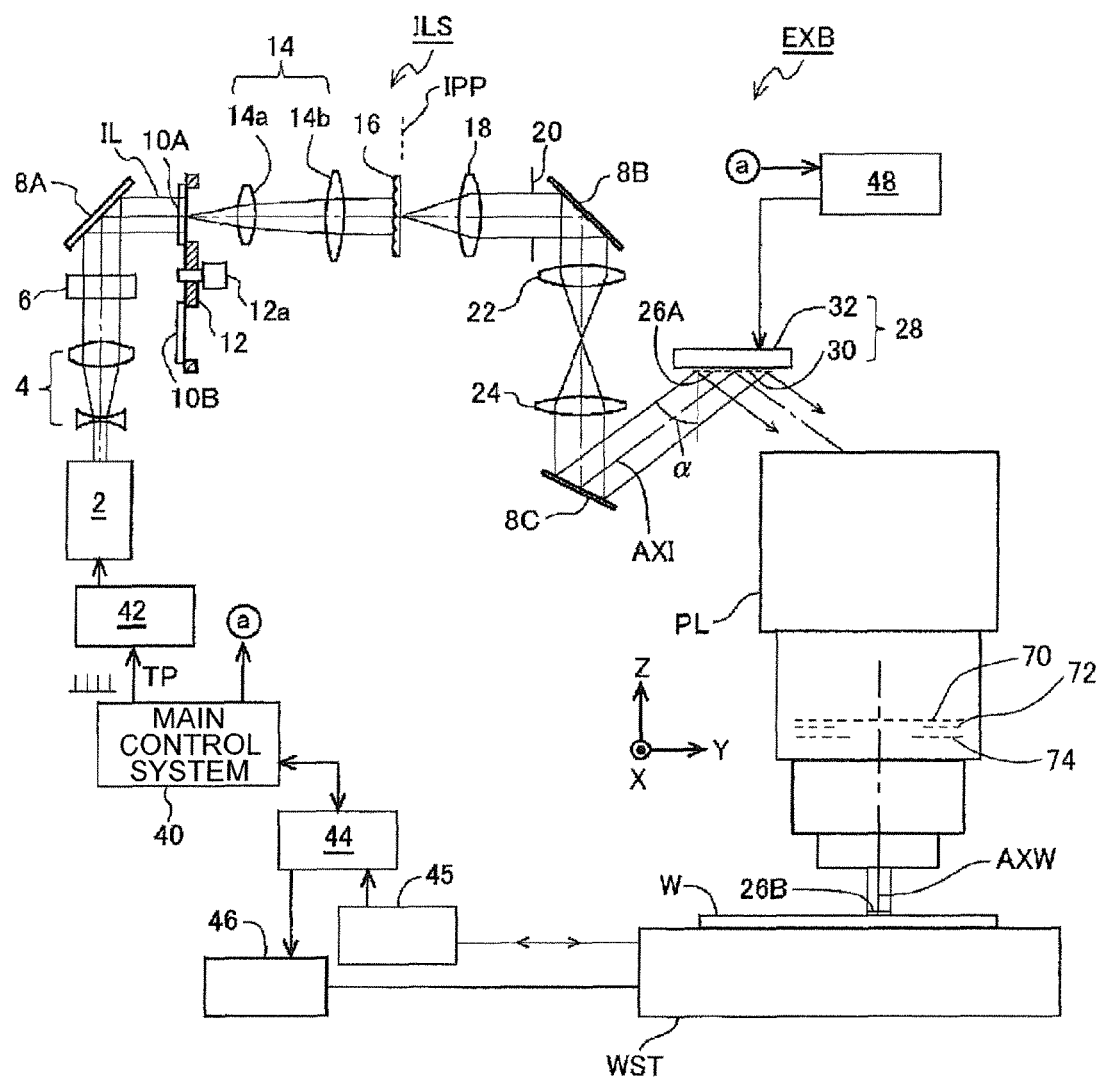
FIG. 10 is a drawing showing a schematic configuration of an exposure apparatus according to a second embodiment.
Figure 11:
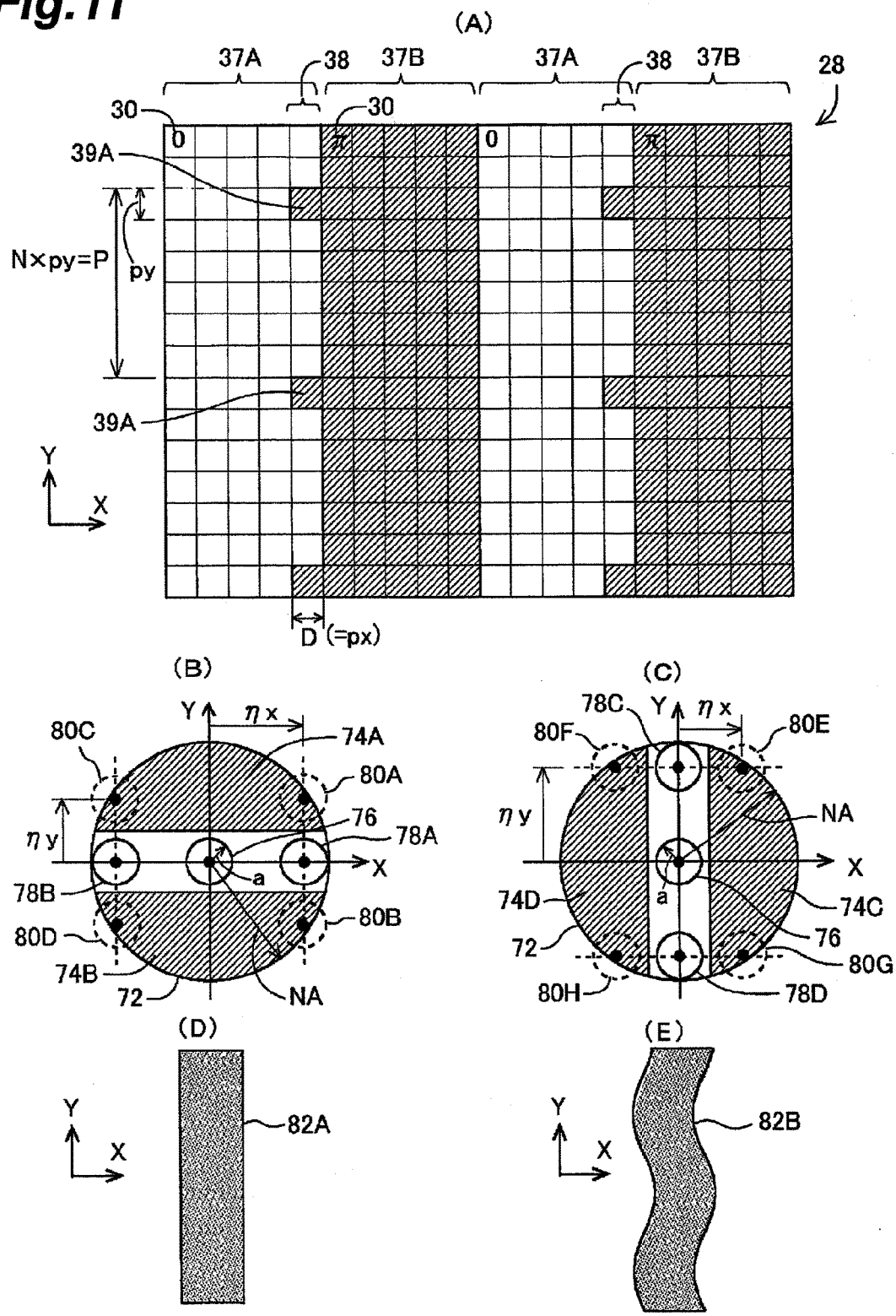
FIG. 11(A) is a partially enlarged view showing an example of a phase distribution set in the spatial light modulator, FIG. 11(B) a drawing showing a pupil filter 74 used for the phase distribution of FIG. 11(A), FIG. 11(C) a drawing showing another configuration example of the pupil filter, FIG. 11(D) an enlarged view showing an example of a formed pattern, and FIG. 11(E) an enlarged view showing an example of a pattern formed without the pupil filter.
Figure 12:
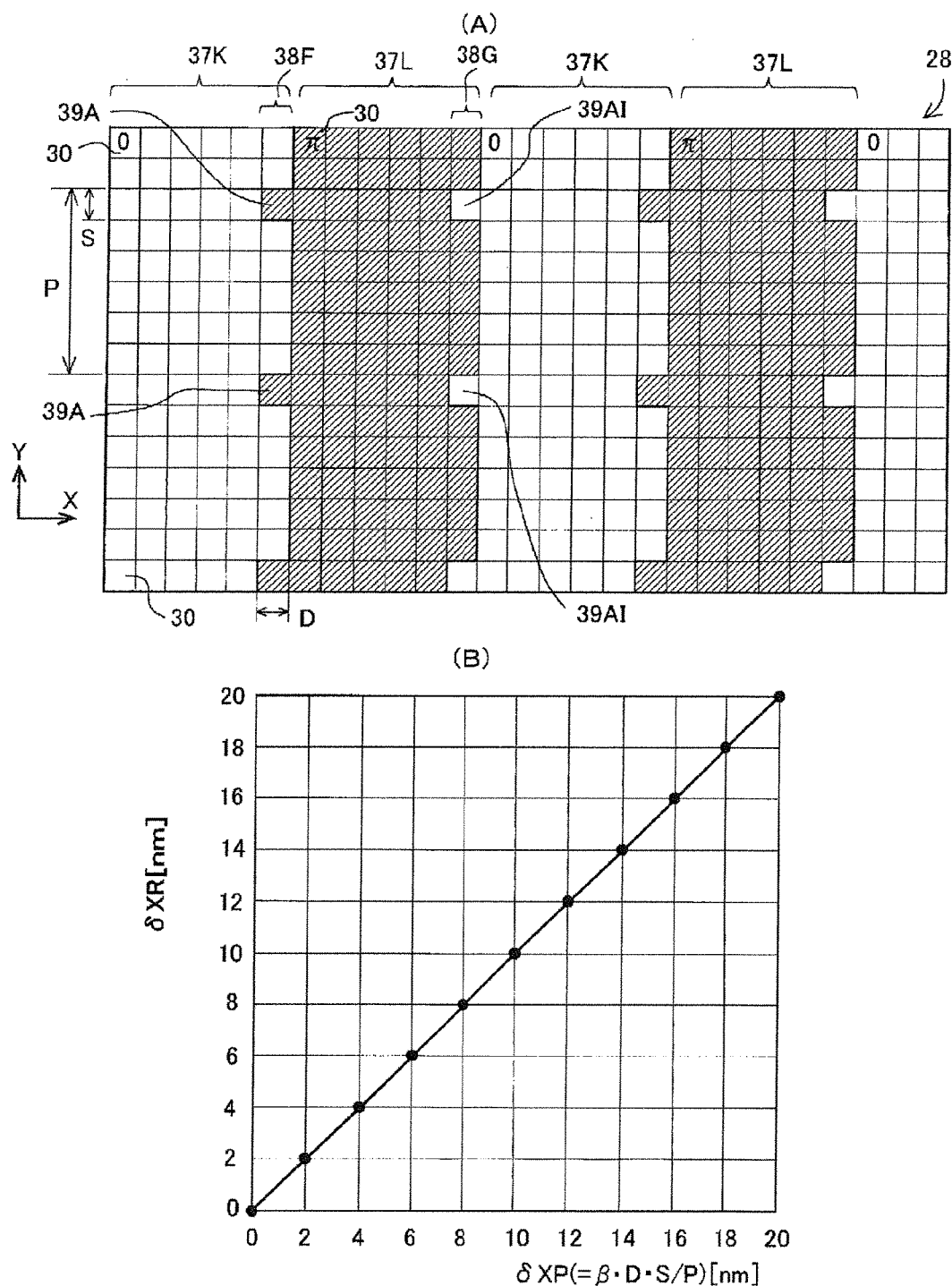
FIG. 12(A) is a drawing showing another example of the phase distribution, and FIG. 12(B) a drawing showing an example of relationship between length of auxiliary pattern elements in phase distribution and shift amount of formed pattern.

Next, the second embodiment of the present invention will be described with reference to FIGS. 10 to 12. FIG. 10 shows a schematic configuration of an exposure apparatus EXB of the maskless method according to the present embodiment. In FIG. 10 the portions corresponding to those in FIG. 1 will be denoted by the same reference signs, without detailed description thereof. In FIG. 10, the exposure apparatus EXB has the illumination optical system ILS, spatial light modulator 28, and projection optical system PL, and is configured to control the phase distribution of the illumination light IL by the plurality of mirror elements 30 in the spatial light modulator 28 and expose the wafer W with an image of a pattern with this phase distribution formed by the projection optical system PL. A variable aperture stop 72 is located near a pupil plane 70 of the projection optical system PL and a pupil filter 74 for blocking predetermined diffracted beams passing through the pupil plane 70 is disposed near the aperture stop 72. The pupil filter 74 is a variable filter which blocks diffracted beams passing through different regions according to exposure target phase distributions. The aperture stop 72 can also serve as the pupil filter 74.

The other configuration than the foregoing is the same as in the exposure apparatus EX in FIG. 1.

FIG. 11(A) shows an example of a phase distribution of the illumination light IL (a phase distribution of mirror elements 30) set in the spatial light modulator 28 in FIG. 10. In FIG. 11(A), each mirror element 30 in rectangular first regions 37A including multiple rows (e.g., four or more rows) in the X-direction and multiple columns (e.g., 50 or more columns) in the Y-direction of mirror elements 30 is in the first state (phase 0), each mirror element 30 in rectangular second regions 37B in almost the same size as the first regions 37A, adjacent in the X-direction to the first regions 37A, is in the second state (phase π), and the first regions 37A and the second regions 37B are alternately arranged in the X-direction. In boundary regions 38 with the X-directional width D between the first regions 37A and the second regions 37B, auxiliary pattern elements 39A with the width (pitch) py and the phase π are arranged at the pitch P equal to N times the pitch py (where N is an integer of 2 or more).

In exposure of the pattern with the phase distribution for forming the pattern with edge portions parallel to the Y-direction as shown in FIG. 11(A), the pupil filter 74 in FIG. 10 blocks diffracted beams by two shield regions 74A, 74B set on both sides of the optical axis in the Y-direction in FIG. 11(B). In FIG. 11(B) and below-described FIG. 11(C), zeroth-order light and diffracted light beams from the spatial light modulator 28 travel through a region not blocked by the pupil filter 74, inside a circular region with the radius of NA defined by the aperture stop 72, and then travel toward the wafer W. The radius NA is the numerical aperture of the projection optical system PL.

In FIG. 11(B), a circular region with the radius a centered on the optical axis is a region where the zeroth-order light beam 76 of the illumination light IL from the illumination optical system ILS passes. When the σ value of the illumination optical system ILS is assumed to be $\sigma_{IL}$, $a=\sigma_{IL} \times NA$. In the present embodiment, ±first-order diffracted beams 78A, 78B in the X-direction from the pattern having the phase distribution of FIG. 11(A) pass as effective imaging beams through circular regions centered on points at distances of ±ηx (ηx<NA) in the X-direction from the optical axis within the aperture stop 72. In contrast to it, since +first-order diffracted beams 80A, 80C and −first-order diffracted beams 80B, 80D in the Y-direction by the auxiliary pattern elements 39A in FIG. 11(A) are unwanted diffracted beams, those diffracted beams 80A, 80C and diffracted beams 80B, 80D are blocked by the shield regions 74A, 74B set by the pupil filter 74. Since the radius of the diffracted beams 78A, 78B as effective imaging beams is equal to the radius a of the zeroth-order light beam 76, the shield regions 74A, 74B are arranged to block the region over the distance a in the +Y-direction and the region over the distance a in the −Y-direction with respect to a straight line passing the optical axis in the aperture stop 72 and extending in parallel with the X-axis.

In this case, a condition for the integer N which defines the pitch of auxiliary pattern elements 39A for keeping the diffracted beams 80A, 80C and 80B, 80D generated in the Y-direction by the auxiliary pattern elements 39A, within the shield regions 74A, 74B is as described below. Specifically, using the wavelength λ of the illumination light IL, the magnification β of the projection optical system PL, and the arrangement pitch (N·py) of the auxiliary pattern elements 39A, the Y-directional distance ηy between the centers of the diffracted beams 80A, 80C and diffracted beams 80B, 80D in the Y-direction by the auxiliary pattern elements 39A and the centers of the effective diffracted beams 78A, 78B is given as follows.

$$\eta y = \lambda/(N\cdot\beta\cdot py) \quad (11)$$

Since this distance ηy needs to be at least larger than the radius a of the zeroth-order light 76, the following formula holds.

$$\eta y = \lambda/(N\cdot\beta\cdot py) > a = \sigma_{IL} \times NA \quad (12)$$

The condition for the integer N is obtained as follows from formula (12).

$$N < \lambda/(NA\cdot\sigma_{IL}\cdot\beta\cdot py) \quad (13)$$

As an example, where λ=193 (nm), NA=1.35 (in application of the liquid immersion method), $\sigma_{IL}$=0.14, and β·py=20 (nm) in formula (13), the integer N may be smaller than 51 as below.

$$N < 51 \quad (14)$$

When formula (14) is met, a part of the pattern obtained by developing the image projected on the wafer W has edge portions parallel to the Y-direction, for example, as shown by a line pattern 82A in FIG. 11(D). In contrast to it, when formula (14) is not met, since unwanted diffracted beams are included in imaging beams, a part of the pattern obtained by developing the image projected on the wafer W comes to have edge portions periodically varying in the Y-direction, for example, as shown by a wave pattern 82B in FIG. 11(E).

In FIG. 11(A), when the X-directional width D of the boundary region 38 is assumed to be equal to the X-directional arrangement pitch px of the mirror elements 30 (which is assumed to be equal to py herein), the control resolution Re of pitch and position of the projected image with the use of the pattern of the phase distribution in FIG. 11(A) is given as follows.

$$Re = \beta\cdot px/N \quad (15)$$

As an example, where β·py=20 (nm) and the integer N is 50 which is the upper limit of the range satisfying formula (14), the control resolution Re becomes 0.4 nm from formula (15).

In the case not using the pupil filter 74 (shield regions 74A, 74B), it is necessary to locate the diffracted beams 80A-80D in FIG. 11(B) outside the region with the radius NA and the value of the integer N in formula (11) needs to be, for example, 6 or less. In this case, the control resolution Re is 3.3 nm from formula (15), which is approximately eight times that in the case using the pupil filter 74.

With the use of the pupil filter 74, therefore, the desired pattern can be formed on the wafer W and the control resolution Re can be made smaller.

For example, in the case of exposure of a pattern in a phase distribution resulting from 90° rotation of the phase distribution in FIG. 11(A), the pupil filter 74 may be configured to shield light in a shield region 74C over the distance a in the +X-direction and a shield region 74D over the distance a in the −X-direction with respect to a straight line passing the optical axis and extending in parallel with the Y-direction in the aperture stop 72, as shown in FIG. 11(C). In FIG. 11(C), +first-order diffracted beam 78C and −first-order diffracted beam 78D are effective imaging beams and +first-order diffracted beams 80E, 80G and −first-order diffracted beams 80F, 80H are unwanted diffracted beams made by the auxiliary pattern elements.

FIG. 12(A) shows a part of another phase distribution set in the spatial light modulator 28 of the present embodiment. In FIG. 12(A), each mirror element 30 in rectangular first regions 37K including multiple rows (e.g., six or more rows) in the X-direction and multiple columns (e.g., 50 or more columns) in the Y-direction of mirror elements 30 is in the first state (phase 0), each mirror element 30 in rectangular second regions 37L in almost the same size as the first regions 37K, adjacent in the X-direction to the first regions 37K, is in the second state (phase π), and the first regions 37K and the second regions 37L are alternately arranged in the X-direction. In boundary regions 38F with the X-directional width D between the first regions 37K and the second regions 37L, auxiliary pattern elements 39A of the phase π with the width S being an integral multiple of the width (pitch) py (each of which consists of one mirror element 30 in FIG. 12(A)) are arranged at the pitch P equal to N times the pitch py. Furthermore, in boundary regions 38G with the X-directional width D between the second regions 37L and the first regions 37K, auxiliary boundary elements 39AI of the phase 0 with the total width S are arranged at the pitch P.

In exposure of the pattern with the phase distribution shown in FIG. 12(A), the pupil filter 74 in FIG. 10 blocks diffracted beams by the two shield regions 74A, 74B set on both sides of the optical axis in the Y-direction in FIG. 11(B). In this case, as the Y-directional width S of auxiliary pattern elements 39A is gradually increased in unit of py, the image of the pattern with the phase distribution in FIG. 12(A) becomes displaced in the X-direction. The relationship between control amount δXP based on the width S of auxiliary pattern elements 39A and the X-directional displacement δXR of the image thereof is, for example, as shown in FIG. 12(B). The control amount δXP is given as follows.

$$\delta XP = \beta\cdot D\cdot S/P \quad (16)$$

FIG. 12(B) shows the case where β·D=20 (nm) and N=10, i.e., the case of the control resolution Re=2 (nm) from formula (15).

In this manner, when the width S of auxiliary pattern elements 39A is controlled with the use of the pupil filter 74, the projected image can be shifted in finer accuracy.

The exposure apparatus used in the present embodiment may use the bitelecentric projection optical system PLA as the exposure apparatus EXA in FIG. 9 does.

Figure 13:
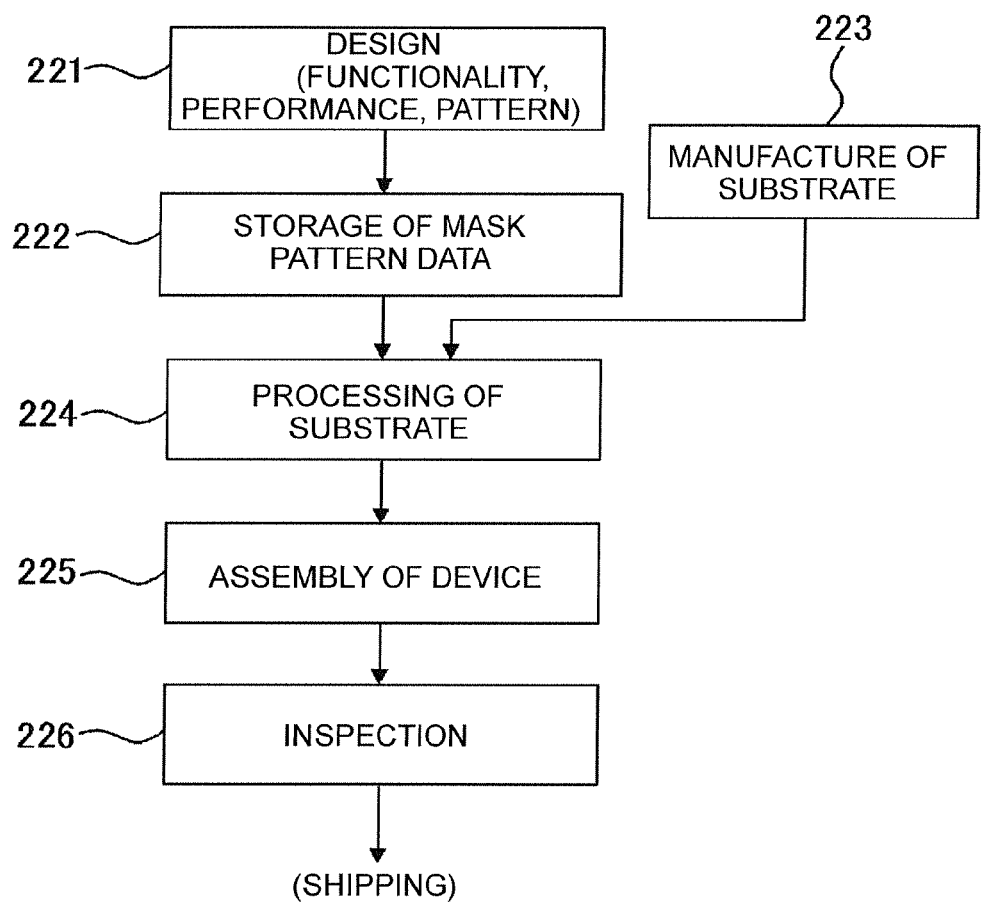
FIG. 13 is a flowchart showing an example of steps for manufacturing electronic devices.

In manufacture of electronic devices (or microdevices), the electronic devices are manufactured, as shown in FIG. 13, through a step 221 to perform design of functionality and performance of the electronic devices, a step 222 to store pattern data of a mask based on this design step, into the main control system of the exposure apparatus EX, EXA in the embodiment, a step 223 to produce a substrate (wafer) as a base material of the devices and coat the substrate with a resist, a substrate processing step 224 including a step of exposing the substrate (photosensitive substrate) with the spatial image of the phase distribution generated in the spatial light modulator 28, 28A by the aforementioned exposure apparatus EX, EXA, EXB (or the exposure method), a step of developing the exposed substrate, and heating (curing) and etching steps of the developed substrate, a device assembly step (including processing processes such as a dicing step, a bonding step, a packaging step, and so on) 225, an inspection step 226, and so on.

This device manufacturing method includes the step of exposing the wafer W with the use of the exposure apparatus (or the exposure method) of the above embodiment, and the step of processing the exposed wafer W (step 224). Therefore, the electronic devices with a microscopic circuit pattern can be manufactured with high accuracy.

The present invention is not limited to the application to semiconductor device manufacturing processes, but the present invention is also widely applicable, for example, to manufacturing processes of liquid crystal display devices, plasma displays, and so on and to manufacturing processes of various devices (electronic devices) such as imaging devices (CMOS type, CCD, etc.), micromachines, MEMS (Microelectromechanical Systems), thin film magnetic heads, and DNA chips.

The present invention is not limited to the above embodiments, but can be realized in various configurations within the scope not departing from the spirit and scope of the present invention. The disclosures in the foregoing Publications, International Publication, U.S. patents, or U.S. Pat. Published Application cited in the present specification are incorporated as part of the description of the present specification. The entire disclosure contents in Japanese Patent Application No. 2010-215107 filed on Sep. 27, 2010 including the specification, the scope of claims, the drawings, and the abstract are incorporated herein by reference in its entirety.

REFERENCE SINGS LIST

EX, EXA, EXB exposure apparatus; ILS, ILSA illumination optical system; PL, PLA projection optical system; W wafer; 28, 28A spatial light modulator; 30 mirror element; 37A, 37C first region; 37B, 37D second region; 38, 38A boundary region; 39A-39D auxiliary pattern elements; 48 modulation control unit.

The invention claimed is:

1. An exposure method for exposing an object with exposure light from a light source to project a pattern onto the object, comprising:
    illuminating a plurality of reflective elements arranged on a predetermined surface with the exposure light from the light source;
    directing the exposure light from the plurality of reflective elements to a projection optical system; and
    exposing the object with the exposure light from the projection optical system,
    wherein the illuminating includes:
    setting first reflective elements of the plurality of reflective elements so as to reflect the exposure light in a first phase, wherein each of the first reflective elements is situated in a first region or a second region of the predetermined surface, wherein the first region is displaced from the second region along a first direction on the predetermined surface; and
    setting second reflective elements of the plurality of reflective elements situated within a third region so as to reflect the exposure light in a second phase different from the first phase, the third region being located between the first region and the second region,
    wherein a first boundary corresponding to a third-region-side edge of the first region is non-linear, the first boundary defined by edges of the first reflective elements that are arranged along the third-region-side edge of the first region, and
    wherein the exposing the object includes exposing an edge of the pattern with the exposure light received from the first reflective elements of the first region that defines the first boundary.

2. The exposure method according to claim 1, wherein a second boundary corresponding to a third-region-side edge of the second region is non-linear, and the second boundary is defined by edges of reflective elements of the first reflective elements that are arranged along the third-region-side edge of the second region.

3. The exposure method according to claim 1, wherein each of the plurality of reflective elements has a size that the projection optical system cannot resolve.

4. The exposure method according to claim 3, wherein a phase difference between the exposure light reflected by the first reflective elements set to reflect at the first phase and the exposure light reflected by the second reflective elements set to reflect at the second phase is 180°.

5. The exposure method according to claim 1, wherein a phase difference between the exposure light reflected by the first reflective elements set to reflect at the first phase and the exposure light reflected by the second reflective elements set to reflect at the second phase is 180°.

6. The exposure method according to claim 1, wherein
    the plurality of reflective elements are arranged at a predetermined pitch, and
    the pattern is a line-and-space pattern having a pitch that is different from a value obtained by multiplying the predetermined pitch with a magnification of the projection optical system.

7. The exposure method according to claim 6, wherein the first boundary has a plurality of projecting portions each oriented toward the third region.

8. The exposure method according to claim 7, wherein the plurality of projecting portions are arranged at a first pitch along a direction along which an edge of the line-and-space pattern extends.

9. The exposure method according to claim 6, wherein the first boundary has a plurality of depressed portions each oriented away from the third region.

10. The exposure method according to claim 9, wherein the plurality of depressed portions are arranged at a first pitch along a direction along which an edge of the line-and-space pattern extends.

11. The exposure method according to claim 1, wherein the first boundary has a plurality of projecting portions each oriented toward the third region.

12. The exposure method according to claim 11, wherein one of the plurality of projecting portions is constituted by one of the first reflective elements.

13. The exposure method according to claim 1, wherein the first boundary has a plurality of depressed portions each oriented away from the third region.

14. The exposure method according to claim 13, wherein one of the plurality of depressed portions is constituted by one of the first reflective elements.

15. A device manufacturing method comprising:
forming a pattern of a photosensitive layer on a substrate, using the exposure method as defined in claim 1; and
processing the substrate with the pattern formed thereon.

16. An exposure apparatus configured to expose an object with exposure light from a light source to project a pattern onto the object, comprising:
a spatial light modulator having a plurality of reflective elements arranged on a predetermined surface;
a projection optical system configured to project the pattern onto the object using the exposure light routed through the plurality of reflective elements; and
a controller configured to drive the plurality of reflective elements in the spatial light modulator,
wherein the controller:
sets first reflective elements of the plurality of reflective elements situated in a first region or a second region so as to reflect exposure light in a first phase, the first region displaced from the second region along a first direction on the predetermined surface; and
sets second reflective elements of the plurality of reflective elements situated within a third region so as to reflect exposure light in a second phase different from the first phase, the third region being located between the first region and the second region,
wherein a first boundary corresponding to a third-region-side edge of the first region is non-linear, the first boundary defined by edges of reflective elements that are included in the first reflective elements and arranged along the third-region-side edge of the first region, and
wherein the exposing the object includes exposing an edge of the pattern with the exposure light received from the reflective elements defining the first boundary.

17. The exposure apparatus according to claim 16, wherein a second boundary corresponding to a third-region-side edge of the second region is non-linear, and the second boundary is defined by edges of reflective elements of the first reflective elements that are situated along the third-region-side edge of the second region.

18. The exposure apparatus according to claim 16, wherein each of the plurality of reflective elements has such a size that the projection optical system cannot resolve.

19. The exposure apparatus according to claim 18, wherein a phase-difference between the exposure light reflected by the first reflective elements in the first phase and the exposure light reflected by the second reflective elements in the second phase is 180°.

20. The exposure apparatus according to claim 19, wherein each of the plurality of reflective elements is movable up and down.

21. The exposure apparatus according to claim 16, wherein a phase difference between the exposure light reflected by the first reflective elements in the first phase and the exposure light reflected by the second reflective elements in the second phase is 180°.

22. The exposure apparatus according to claim 21, wherein each of the plurality of reflective elements is movable up and down.

23. The exposure apparatus according to claim 16, wherein
the plurality of reflective elements is arranged at a predetermined pitch, and
the pattern is a line-and-space pattern having a pitch that is different from a value obtained by multiplying the predetermined pitch with a magnification of the projection optical system.

24. The exposure apparatus according to claim 23, wherein the controller controls the plurality of reflective elements so that the first boundary has a plurality of projecting portions each oriented toward the third region.

25. The exposure apparatus according to claim 24, wherein the controller controls the plurality of reflective elements so that the plurality of projecting portions are arranged at a first pitch along a direction along which an edge of the line-and-space pattern extends.

26. The exposure apparatus according to claim 23, wherein the controller controls the plurality of reflective elements so that the first boundary has a plurality of depressed portions each oriented away from the third region.

27. The exposure apparatus according to claim 26, wherein the controller controls the plurality of reflective elements so that the plurality of depressed portions is arranged at a first pitch along a direction along which an edge of the line-and-space pattern extends.

28. The exposure apparatus according to claim 16, wherein the controller controls the plurality of reflective elements so that the first boundary has a plurality of projecting portions each oriented toward the third region.

29. The exposure apparatus according to claim 28, wherein one of the plurality of projecting portions is constituted by one of the first reflective elements.

30. The exposure apparatus according to claim 16, wherein the controller controls the plurality of reflective elements so that the first boundary has a plurality of depressed portions each oriented away from the third region.

31. The exposure apparatus according to claim 30, wherein one of the plurality of depressed portions is constituted by one of the first reflective elements.

32. A device manufacturing method comprising:
forming a pattern of a photosensitive layer on a substrate, using the exposure apparatus as defined in claim 16; and
processing the substrate with the pattern formed thereon.

33. An exposure method for exposing an object with exposure light from a light source to project a pattern onto the object, comprising:
illuminating a plurality of reflective elements arranged on a predetermined surface with the exposure light from the light source;
directing the exposure light from the plurality of reflective elements to a projection optical system; and
exposing the object with the exposure light from the projection optical system,
wherein the illuminating includes:
setting first reflective elements of the plurality of reflective elements to a first condition, wherein each of the first reflective elements is situated in a first region or a second region of the predetermined surface, wherein the first region is displaced from the second region along a first direction on the predetermined surface; and
setting second reflective elements of the plurality of reflective elements situated within a third region to a second condition different from the first condition, the third region being located between the first region and the second region,
wherein a first boundary corresponding to a third-region-side edge of the first region is non-linear, the first boundary defined by edges of the first reflective elements that are arranged along the third-region-side edge of the first region,
wherein the directing the exposure light includes directing exposure light reflected by the first reflective elements set at the first condition to the projection optical system in a first phase, and directing exposure light reflected by the second reflective elements set at the second condition to the projection optical system in a second phase different from the first phase, and wherein the exposing the object includes exposing an edge of the pattern with the exposure light received from the first reflective elements of the first region that defines the first boundary.

34. An exposure apparatus configured to expose an object with exposure light from a light source to project a pattern onto the object, comprising:

a spatial light modulator having a plurality of reflective elements arranged on a predetermined surface;

a projection optical system configured to project the pattern onto the object using the exposure light routed through the plurality of reflective elements; and a controller configured to drive the plurality of reflective elements in the spatial light modulator, wherein the controller:

sets first reflective elements of the plurality of reflective elements situated in a first region or a second region to a first condition, the first region displaced from the second region along a first direction on the predetermined surface; and sets second reflective elements of the plurality of reflective elements situated within a third region to a second condition different from the first condition, the third region being located between the first region and the second region, wherein a first boundary corresponding to a third-region-side edge of the first region is non-linear, the first boundary defined by edges of reflective elements that are included in the first reflective elements and arranged along the third-region-side edge of the first region, wherein the spatial light modulator is situated to direct the exposure light received from the light source to the projection optical system, wherein the light reflected by the first reflective elements set at the first condition has a first phase, light reflected by the second reflective elements set at the second condition has a second phase, different from the first phase, and wherein the exposing the object includes exposing an edge of the pattern with the exposure light received from the reflective elements defining the first boundary.

35. An exposure method for exposing an object with exposure light from a light source to project a pattern onto the object, comprising:

illuminating a plurality of reflective elements arranged on a predetermined surface with the exposure light from the light source;

directing the exposure light from the plurality of reflective elements to a projection optical system; and exposing the object with the exposure light from the projection optical system, wherein the illuminating includes:

setting reflective elements in a first region and a second region so as to reflect exposure light in a first phase, wherein the first region is displaced from the second region along a first direction on the predetermined surface;

setting all reflective elements in a third region so as to reflect exposure light in a second phase different from the first phase, the third region being located between the first region and the second region, wherein a first boundary corresponding to a third-region-side edge of the first region is non-linear, the first boundary defined by edges of the first reflective elements that are arranged along the third-region-side edge of the first region, and wherein the exposing the object includes exposing an edge of the pattern with the exposure light received from the first reflective elements of the first region that defines the first boundary.

36. An exposure apparatus configured to expose an object with exposure light from a light source to project a pattern onto the object, comprising:

a spatial light modulator having a plurality of reflective elements arranged on a predetermined surface;

a projection optical system configured to project the pattern onto the object using the exposure light routed through the plurality of reflective elements; and a controller configured to drive the plurality of reflective elements in the spatial light modulator, wherein the controller:

sets reflective elements of the plurality of reflective elements situated in a first region or a second region so as to reflect exposure light in a first phase, the first region displaced from the second region along a first direction on the predetermined surface; and sets all reflective elements in a third region so as to reflect exposure light in a second phase different from the first phase, the third region being located between the first region and the second region, wherein a first boundary corresponding to a third-region-side edge of the first region is non-linear, the first boundary defined by edges of reflective elements that are included in the first reflective elements and arranged along the third-region-side edge of the first region, and wherein the exposing the object includes exposing an edge of the pattern with the exposure light received from the reflective elements defining the first boundary.

* * * * *